(12) United States Patent
Iwata et al.

(10) Patent No.: US 10,264,662 B2
(45) Date of Patent: Apr. 16, 2019

(54) PLASMA PROCESSING APPARATUS

(71) Applicant: TOKYO ELECTRON LIMITED, Tokyo (JP)

(72) Inventors: Manabu Iwata, Miyagi (JP); Naoyuki Umehara, Miyagi (JP); Hiroki Endo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 865 days.

(21) Appl. No.: 13/737,341

(22) Filed: Jan. 9, 2013

(65) Prior Publication Data

US 2013/0199727 A1 Aug. 8, 2013

Related U.S. Application Data

(60) Provisional application No. 61/590,398, filed on Jan. 25, 2012.

(30) Foreign Application Priority Data

Jan. 10, 2012 (JP) .................................. 2012-002171

(51) Int. Cl.
*H05H 1/46* (2006.01)
*H01J 37/32* (2006.01)

(52) U.S. Cl.
CPC ......... *H05H 1/46* (2013.01); *H01J 37/32091* (2013.01); *H01J 37/32155* (2013.01);
(Continued)

(58) Field of Classification Search
CPC .......... H01J 37/32174; H01J 37/32155; H05H 2001/4675; H05H 2001/4682; H05H 1/46
See application file for complete search history.

(56) References Cited

U.S. PATENT DOCUMENTS

2004/0246074 A1* 12/2004 Humphrey ............... H03J 5/244
333/174
2007/0235426 A1* 10/2007 Matsumoto ....... H01J 37/32165
219/121.43
2008/0251207 A1* 10/2008 Chen ................. H01J 37/32082
156/345.48

FOREIGN PATENT DOCUMENTS

JP 7-302786 A 11/1995

* cited by examiner

*Primary Examiner* — Parviz Hassanzadeh
*Assistant Examiner* — Margaret D Klunk
(74) *Attorney, Agent, or Firm* — Rothwell, Figg, Ernst & Manbeck, P.C.

(57) ABSTRACT

Provided is a capacitively coupled plasma processing apparatus which improves a controllability of the RF bias function and reliably prevents unwanted resonance from being generated on a RF transmission line between a counter electrode and ground potential to enhance reliability of the plasma process. In the capacitive coupled type plasma processing apparatus, three kinds of RF powers from a first, second and third RF power supplies (35, 36, 38) are superimposed and applied to susceptor (lower electrode) (16). In such a three-frequency superimposing and applying application scheme, the frequency-impedance characteristic around upper electrode (48) is considered to prevent a serial resonance from occurring on an RF transmission line around upper electrode (48) in consideration of all the low order frequencies of the IMD relevant to and affecting the plasma process. Since the fluorocarbon layer by itself functions as an antireflective film and a harm mask, the reliability of processing can be improved, while reducing the cost.

6 Claims, 15 Drawing Sheets

(52) U.S. Cl.
CPC .................. *H01J 37/32165* (2013.01); *H05H 2001/4675* (2013.01); *H05H 2001/4682* (2013.01)

US 10,264,662 B2

PLASMA PROCESSING APPARATUS

CROSS-REFERENCE

This application claims priority to U.S. Provisional Application 61/590,398, filed Jan. 25, 2012, and further claims priority to Japanese Application Number 2012-002171, filed Jan. 10, 2012, the entire contents of each of which are hereby incorporated by reference.

TECHNICAL FIELD

The present disclosure relates to a technique that performs a plasma process on a target substrate, and more particularly to a capacitively coupled plasma processing apparatus.

BACKGROUND

In an etching process, a deposition process, an oxidation process or a sputtering process for manufacturing a semiconductor device or Flat Panel Display (FPD), plasma is widely used as a processing gas in order to facilitate a good reaction at a relatively low temperature. In such a type of plasma process, a high frequency (RF) power or microwave power is used to discharge or ionize the process gas within a vacuum processing container.

In a capacitively coupled plasma processing apparatus, an upper electrode and a lower electrode are disposed in parallel to each other within the processing container, the target substrate (e.g., a semiconductor wafer or a glass substrate) is placed on the lower electrode, and an RF power having a frequency (normally, 13.56 MHz or more) suitable for generating plasma is applied to the upper electrode or the lower electrode. Electrons are accelerated by the electric field generated between the electrodes facing each other due to an application of the RF power, and plasma is generated by the collision and ionization between electrons and the process gas. Also, a thin film may be deposited on a substrate, or a material or a thin film on the surface of the substrate may be etched due to the surface reaction by a gas phase reaction or a surface reaction of radicals or ions contained in the plasma.

As described above, radicals and ions incident onto the substrate play an important role in the plasma process. In particular, ions are important in that ions exhibit a physical action by an impact occurring when the ions are incident onto the substrate.

Conventionally, an RF bias method has been widely used in a plasma process. In the RF bias method, an RF power having a relatively low frequency (e.g., 13.56 MHz or less) is applied to a lower electrode, and ions contained in the plasma are accelerated and attracted on the substrate by a negative bias voltage or sheath voltage generated on the lower electrode. As a result, ions from plasma can be accelerated to be collided onto the substrate to facilitate surface reaction, anisotropic etching or film reforming.

[Patent Document 1]
Japanese Patent Application Laid-Open No. H7-302786
In the conventional capacitively coupled type plasma processing apparatus equipped with the RF bias function as described above, an RF for attracting ions is limited to one kind (single frequency), and the RF power and self-bias voltage or sheath voltage on the lower electrode are used as control parameters.

However, the present inventors have researched on a RF bias action in the course of developing a technology of a plasma process and have found out that a conventional method which uses a single RF for attracting ions has a difficulty in controlling the ion energy distribution in the state-of-the-art plasma process that requires a complex process characteristic.

More specifically, when analyzing the Ion Energy Distribution (IED) of ions that are incident on the substrate when a single RF is used for attracting ions, the energies of all incident ions are collected regularly in a continued energy band, and more ions are concentrated (a peak appears) in the vicinity of the maximum energy and the minimum energy, as illustrated in FIG. 15A to FIG. 15C and FIG. 16A to FIG. 16C. Accordingly, if an average of ion energies as well as the maximum energy and the minimum energy at which ions are more concentrated can be freely varied, an improvement of controllability of the RF bias function required for a plasma process is expected, but when the single RF is used, there is no case where the maximum energy and the minimum energy at which more ions are concentrated can be freely varied.

According to the conventional method, when an RF corresponding to a relatively low frequency of, for example, 0.8 MHz for attracting ions is used and the RF power is varied, the characteristic of ion energy distribution is changed as illustrated in FIG. 15A (low power level), FIG. 15B (intermediate power level), and FIG. 15C (high power level). That is, the maximum energy is varied into 1000 eV (FIG. 15A), 2000 eV (FIG. 15B), and 3000 eV (FIG. 15C) in proportional to the RF power while the minimum energy is being fixed at about 0 eV.

However, when an RF corresponding to a relatively high frequency of, for example, 13 MHz for attracting ions is used and the RF power is varied, the characteristic of ion energy distribution is changed as illustrated in FIG. 16A (low power level), FIG. 16B (intermediate power level), and FIG. 15C (high power level). That is, the maximum energy is varied into 650 eV, 1300 eV, 1950 eV in proportional to the RF power, while the minimum energy is also varied into 350 eV, 700 eV, 1050 eV in proportional to the RF power.

While FIG. 15A to FIG. 15C and FIG. 16A to FIG. 16C illustrate the characteristics of ion energy distribution of $Ar^+$ ion, other ions exhibit the same characteristics (patterns) as well.

As described above, in the conventional method, even though the maximum energy or the average energy of the ion energy distribution may be arbitrarily varied, the minimum energy cannot be arbitrarily varied independently from the maximum energy. Therefore, the characteristic of the ion energy distribution, for example, indicated by an imaginary line (a dashed dotted line) K of FIG. 16C may not be achieved. Accordingly, a tradeoff between the etching rate, the selection ratio and the etched shape in a high aspect ratio contact (HARC) plasma etching may not be avoided readily.

The present disclosure has been made in an effort to solve the problems described above, and intends to provide a plasma processing apparatus which improves a controllability of the RF bias function, reliably prevents unwanted resonance from being generated on a RF transmission line between a counter electrode and ground potential, and enhances the reliability of the plasma process.

SUMMARY

According to a first aspect of the present disclosure, there is provided a plasma processing apparatus including: a vacuum exhaustible processing container that accommodates a target substrate to be able to be carried in and out in relation to the processing container; first and second electrodes disposed to be opposed to each other within the processing container to form a processing space therebetween where plasma is generated so that a desired processing is performed on the substrate held on the first electrode under the plasma; a first RF power supply that applies a first RF power having a first frequency $f_1$ to the first electrode; a second RF power supply that applies a second RF power having a second frequency $f_2$ to the first electrode; a third RF power supply that applies a third RF power having a third frequency $f_3$ to the first electrode; and a filter circuit connected between the second electrode and a member having a ground potential. The first frequency $f_1$ is in a range of from 100 kHz to 6 MHz, the second frequency $f_2$ is in a range of from 6 MHz to 40 MHz, and the third frequency $f_3$ is in a range of from 40 MHz to 300 MHz, the relationships of $2f_1<f_2$ and $2f_2<f_3$ are established. The filter circuit is configured such that, in a case where $3f_2<f_3$, assuming that $(f_1+f_2)$ is A and the lower one of $2f_2$ and $(f_3-f_2)$ is B, no resonant frequency is present in the frequency range of $f_1<f\leq A$ and $B\leq f<f_3$, and a single serial resonant frequency $f_s$ and a single parallel resonant frequency $f_p$ are present in the frequency range of A<f<B with satisfying a relationship of $f_s<f_p$, in a frequency-impedance characteristic when expecting an RF transmission line which spans from an interface between the processing space and the second electrode through the second electrode to a ground potential, and in a case where $f_3<3f_2$, assuming that the higher one of $(f_3-f_2)$ and $(f_1+f_2)$ is A and the lower one of $2f_2$ and $(f_3-f_1)$ be B, no resonant frequency is present in the frequency range of $f_1<f\leq A$ and $B\leq f<3f_2$ (or $f_3$), and a single serial resonant frequency $f_s$ and a single parallel resonant frequency $f_p$ are present in the frequency range of A<f<B with satisfying a relationship of $f_s<f_p$, in a frequency-impedance characteristic when expecting an RF transmission line which spans from a boundary surface between the processing space and the second electrode through the second electrode to a ground potential.

In the configuration described above, a first RF power having a first RF and a second RF power having a second RF suitable for attracting ions are superimposed and applied on the first electrode on which the target substrate is placed. Accordingly, the minimum energy and the maximum energy may be independently controlled in energy distribution of ions that incident onto the substrate from plasma. Further, the characteristic of ion energy distribution may be formed in a concaved shape or flat shape, and the characteristic of ion energy distribution may be optimized for various process characteristics or a complex process characteristic. Furthermore, the process characteristics may be optimized.

Meanwhile, since a plasma is generally a nonlinear load, harmonic frequencies having frequencies corresponding to an integer multiple of fundamental frequencies and intermodulation distortions (IMDs) having frequencies corresponding to the sum or difference either between the fundamental frequencies or between the fundamental frequencies and the harmonics are inevitably generated. The powers of the fundamental frequencies are increasingly absorbed as powers of these harmonics or IMDs is increased, and further, when a high current flows into the filter circuit, there may be a case where a circuit element is burned to be damaged. In a capacitively coupled plasma processing apparatus, occurrence of these undesirable phenomena is remarkable when a serial resonance is generated with respect to any one of the harmonics or the IMDs on an RF transmission line which spans from the plasma within the chamber through the counter electrode (second electrode) to the ground potential. Of course, since an impedance element of the filter circuit may be burned even when a serial resonance is generated with respect to any one of the fundamental frequencies, so that it is undesirable.

In the plasma processing apparatus of the present disclosure, the frequency-impedance characteristic as described above is implemented on the RF transmission line around the second electrode through the filter circuit. Accordingly, even when process conditions are set arbitrarily, a possible occurrence of the serial resonance on the RF transmission line around the second electrode may be obviated. Accordingly, unless the powers of the fundamental frequencies are converted into the harmonics or IMDs to cause loss of the powers, the circuit elements of the filter circuit are also not burnt to be damaged by a high current.

According to the plasma processing method and the plasma processing apparatus of the present disclosure, with the configurations and operations as described above, the controllability of the RF bias function is enhanced and an unwanted resonance is reliably prevented from being generated on the RF transmission line between the counter electrode and ground potential. Thus, the reliability of the plasma process can be enhanced.

DETAILED DESCRIPTION

Hereinafter, exemplary embodiments of the present disclosure will be described with reference to FIG. 1 to FIG. 14.

[Configuration of the Entire Apparatus]

Figure 1:
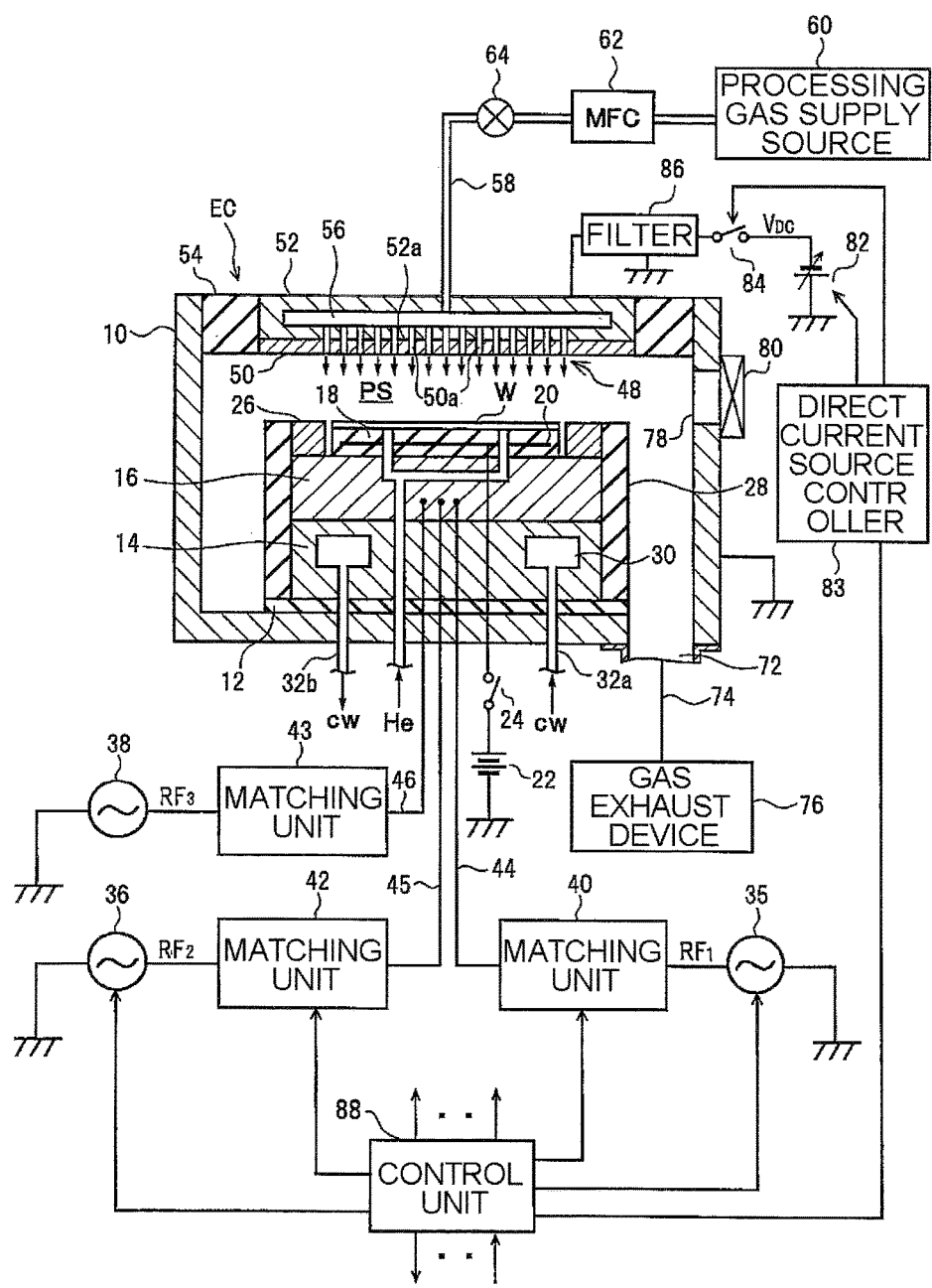
FIG. 1 is a cross sectional view illustrating a configuration of a plasma processing apparatus according to an embodiment of the present disclosure.

FIG. 1 illustrates a configuration of a plasma processing apparatus according to an exemplary embodiment of the present disclosure. The plasma processing apparatus is configured as a capacitively coupled plasma etching apparatus of a lower three-frequency power applying scheme which applies three RF powers to a lower electrode, and includes a cylindrical vacuum chamber (processing container) 10 made of, for example, aluminum of which a surface is alumite-treated (anodized). Vacuum chamber 10 is grounded.

A cylindrical susceptor support 14 is disposed on the bottom of chamber 10 through an insulating plate 12 such as a ceramic and a susceptor 16 made of, for example, aluminum is provided on susceptor support 14. Susceptor 16 constitutes a lower electrode and a target substrate, for example, a semiconductor wafer W, is placed thereon.

An electrostatic chuck 18 for holding semiconductor wafer W by an electrostatic adsorption force is provided on the top surface of susceptor 16. Electrostatic chuck 18 is configured such that an electrode 20 made of a conductive film is embedded between a pair of insulating layers or insulating sheets, and a DC power supply 22 is electrically connected to electrode 20 via a switch 24. Semiconductor wafer W may be adhered to and held on electrostatic chuck 18 by an electrostatic force by a DC voltage from DC power supply 22. A focus ring 26 made of, for example, silicon, for enhancing in-plane uniformity of etching process is disposed on the top surface of susceptor 16 around electrostatic chuck 18. A cylindrical inner wall member 28 made of, for example, quartz is attached on a side surface of susceptor 16 and susceptor support 14.

A refrigerant chamber or refrigerant passage 30 extending in, for example, a circumferential direction is provided inside of susceptor support 14. A refrigerant having a predetermined temperature, for example, a cooling water cw is circulated and supplied to refrigerant passage 30 from an external chiller unit (not illustrated) through pipes 32a, 32b. A process temperature of semiconductor wafer W on susceptor 16 can be controlled depending on the temperature of refrigerant cw. A heat transfer gas, such as, He gas from a heat transfer gas supply equipment (not illustrated) is supplied between the top surface of electrostatic chuck 18 and the rear surface of semiconductor wafer W through a gas supply line 34.

Each of a first, second and third RF power supplies 35, 36, 38 is electrically connected to susceptor 16 through matching units 40, 42, 43 and lower power feeding conductors 44, 45, 46, respectively. Lower power feeding conductors 44, 45, 46 may be a common conductor such as, for example, a power feeding rod.

First RF power supply 35 is configured such that a first high frequency power $RF_1$ having a relatively low frequency $f_1$ of 100 kHz to 6 MHz suitable for attracting ions on semiconductor wafer W on susceptor 16 is output with a variable power. Second RF power supply 36 is configured such that a second high frequency power $RF_2$ having a relatively high frequency $f_2$ of 6 MHz to 40 MHz suitable for attracting ions on semiconductor wafer W on susceptor 16 is output with a variable power. Third RF power supply 38 is configured such that a third high frequency power $RF_3$ having a high frequency $f_3$ of 40 MHz to 300 MHz suitable for an RF discharge, that is, plasma generation by capacitive coupling of process gases is output with a variable power. Meanwhile, when first high frequency power $RF_1$ and second high frequency power $RF_2$ are concurrently applied, $RF_1$ and $RF_2$ are superimposed in a relationship of $f_1 < f_2$, and when second high frequency power $RF_2$ and third high frequency power $RF_3$ are concurrently applied, $RF_2$ and $RF_3$ are superimposed in a relationship of $f_2 < f_3$.

An upper electrode 48 is provided above susceptor 16 to face and in parallel with susceptor 16. Upper electrode 48 is constituted with an electrode plate 50 and an electrode support 52 and is attached to an upper portion of chamber through a ring shaped insulator 54. Electrode plate 50 is made of a semiconductor material such as, for example, Si or SiC, and has a plurality of gas ejection holes 50a. Electrode support 52 is made of a conductive material such as, for example, aluminum of which a surface is alumite-treated, and detachably supports electrode plate 50. A plasma generation space or a processing space PS is set between upper electrode 48 and susceptor 16. Ring shaped insulator 54 is made of, for example, alumina ($Al_2O_3$), hermetically fills a gap between an outer peripheral surface of upper electrode 48 and a sidewall of chamber 10, and physically supports upper electrode 48 in a non-grounded state. In electrical sense, a capacitance of fixed value (hereinafter, referred to as "electrode stray capacitance") EC is formed between upper electrode 48 and chamber 10 with ring shaped insulator 54 being interposed therebetween.

Electrode support 52 has a gas buffer chamber 56 formed therein and, in the bottom side thereof, has a plurality of gas ventilation holes 52a communicating with gas ejection holes 50a of electrode plate 50 from gas buffer chamber 56. Gas buffer chamber 56 is connected with a process gas supply source 60 through a gas supply pipe 58, and a mass flow controller (MFC) 62 and an opening/closing valve 64 are provided in gas supply pipe 58. When a predetermined amount of the process gas is introduced into gas buffer chamber 56 from process gas supply source 60, the process gas is ejected into a processing space PS from gas ejection holes 50a of electrode plate 50 toward semiconductor wafer W on susceptor 16 in a shower pattern. As described above, upper electrode 48 also serves as a shower head for supplying the process gas.

An annular space formed between susceptor 16 and susceptor support 14 and chamber 10 is defined as a gas exhaust space, and a gas exhaust port 72 of chamber 10 is formed at the bottom of the gas exhaust space. A gas exhaust apparatus 76 is connected to gas exhaust port 72 through a gas exhaust pipe 74. Gas exhaust apparatus 76 includes a vacuum pump such as a turbo molecular pump, and particularly, the processing space PS can be depressurized to a desired vacuum level. A gate valve 80 which opens and closes a carry-in/out port 78 for semiconductor wafer W is attached to the sidewall of chamber 10.

An output terminal of a DC power supply unit 82 installed outside of chamber 10 is electrically connected to an upper electrode 48 through a switch 84 and a filter circuit 86. DC power supply unit 82 is formed by, for example, a controllable DC power supply, and is configured such that a DC voltage $V_{DC}$ in a range of from −2000 V to +1000 V can be output. Alternatively, DC power supply unit 82 may be provided with a plurality of DC power supplies to supply a plurality of different DC voltages, and may selectively output one of the plurality of DC voltages. A polarity and absolute value of output (voltage and current) of DC power supply unit 82 and switching ON and OFF of switch 84 are controlled by a DC power supply controller 83 under instructions from a control unit 88 to be described below.

Filter circuit 86 is configured to apply the DC voltage $V_{DC}$ from DC power supply unit 82 to upper electrode 48, and to allow an RF current input from susceptor 16 through processing space PS and upper electrode 48 to flow to a grounded line, but not to flow to DC power supply unit 82 side. In the present exemplary embodiment, the configuration and the circuit constant of filter circuit 86 are very important, and will be described below in detail.

A DC grounded component (not illustrated) made of a conductive material, for example, Si or SiC, is attached to an appropriate position facing the processing space PS within chamber 10. The DC grounded component is grounded through a ground line (not illustrated) at all times.

Control unit 88 includes a microcomputer, and controls individually and comprehensively the operations of respective components, for example, switch 24 for the electrostatic chuck, first, second, third RF power supplies 35, 36, 38, matching units 40, 42, 43, process gas supply units 60, 62, 64, gas exhaust apparatus 76, DC power supply unit 82 and switch 84 for DC bias, a chiller unit, and a heat transfer gas supply unit, provided in the plasma etching apparatus. Further, control unit 88 is connected with a touch panel (not illustrated) that serves as a man-machine interface and a storage device (not illustrated) that stores various programs or data such as settings. In the present exemplary embodiment, control unit 88 is represented as a single control unit, but it may be configured such that a plurality of control units share the function of control unit 88 hierarchically or in parallel.

In the plasma etching apparatus, a gate valve 80 is open first, and the semiconductor wafer W to be processed is carried into chamber 10 and placed on electrostatic chuck 18 in order to perform an etching process. Also, a predetermined gas, that is, an etching gas (generally a mixed gas) from process gas supply source 60 is introduced into chamber 10 at a predetermined flow rate and in a flow rate ratio, and the pressure in chamber 10 is exhausted to be set to a predetermined vacuum level by gas exhaust apparatus 76. Further, a third high frequency power $RF_3$ having a frequency of 40 MHz to 300 MHz to generate plasma is applied to upper electrode 48 with a predetermined power level from third RF power supply 38. Still further, a first high frequency power $RF_1$ having a frequency of 100 KHz to 6 MHz for attracting ions and a second high frequency power $RF_2$ having a frequency of 6 MHz to 40 MHz for attracting ions are applied to susceptor (lower electrode) 16 from first and second RF power supplies 35, 36, at predetermined power levels, respectively. Still further, the heat transfer gas (He gas) is confined in a contact interface between electrostatic chuck 18 and semiconductor wafer W by the electrostatic attraction force by turning ON switch 24. Still further, a predetermined DC voltage $V_{DC}$ from DC power supply unit 82 is applied to upper electrode 48 by turning ON switch 84 as necessary. An etching gas ejected from a shower head (upper electrode) 48 is plasmatized between electrodes 16, 48 by RF discharge, and a film of main surface of the semiconductor wafer W is etched by radicals or ions contained in the plasma.

The plasma etching apparatus of the present exemplary embodiment has hardware components 32 to 46 in which two kinds of high frequency powers $RF_1$ having a frequency of 100 kHz to 6 MHz and $RF_2$ having a frequency of 6 MHz to 40 MHz suitable for attracting ions from two RF power supplies 35, 36 are superimposed and applied to susceptor 16 in order to control energy of ions incident onto the semiconductor wafer W from the plasma during the process, and is configured to control a total power and power ratio of both of high frequency powers $RF_1$ and $RF_2$ depending on specifications, conditions or recipes of the etching process.

[RF Bias Function in the Embodiment]

Figure 2:
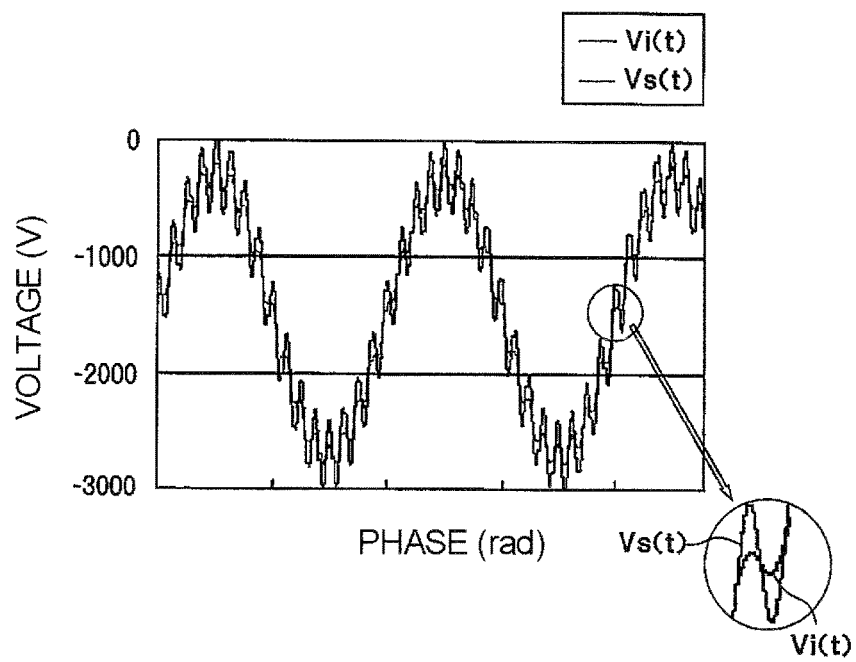
FIG. 2 is a view illustrating waveforms of a sheath voltage and an ion response voltage in a dual-frequency RF bias method according to the embodiment.

In the plasma etching apparatus of the present embodiment as described above, first high frequency power $RF_1$ having a frequency of, e.g., 0.8 MHz, and second high frequency power $RF_2$ having a frequency of, e.g., 13 MHz for attracting ions are superimposed and applied to susceptor (lower electrode) 16 during the process. Then, a negative polarity sheath voltage $V_s(t)$ in which both $RF_1$ and $RF_2$ are superimposed as illustrated in FIG. 2 is generated on an ion sheath generated on susceptor 16 facing the plasma generation space PS or the surface of semiconductor wafer W. In the meantime, FIG. 2 illustrates a case where second high frequency power $RF_2$ is remarkably lower than first high frequency power $RF_1$ in order to make understand readily a state where both $RF_1$ and $RF_2$ are superimposed.

Ions from the plasma are accelerated by sheath voltage $V_s(t)$ to be incident on the surface of semiconductor wafer W. In this case, acceleration and energy of the incident ions depend on an instantaneous value (absolute value) of sheath voltage $V_s(t)$ at the time when the ions are incident thereto. That is, ions introduced into the ion sheath when the instantaneous value (absolute value) of sheath voltage $V_s(t)$ is large are incident on the surface of the wafer with a large acceleration or kinetic energy, while ions introduced into the ion sheath when the instantaneous value (absolute value) of the sheath voltage $V_s(t)$ is small are incident onto the surface of the wafer at a small acceleration or kinetic energy.

Figure 3:
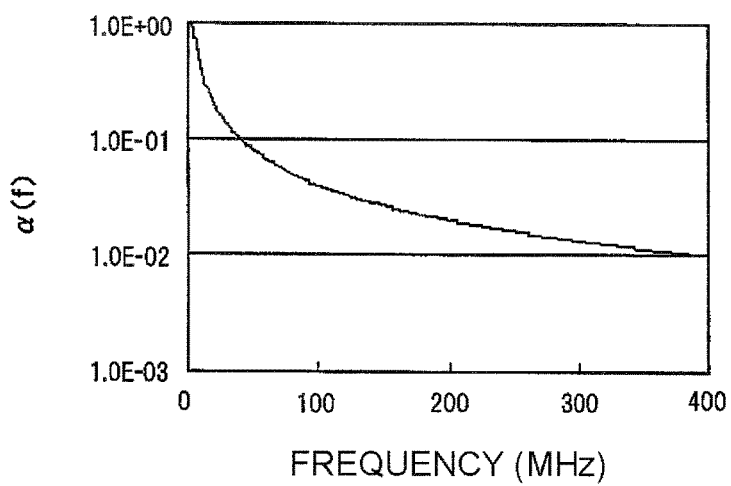
FIG. 3 is a view illustrating a conversion function used in the embodiment.

However, ions respond to (accelerate) sheath voltage $V_s(t)$ at a certain sensitivity of 100% (coefficient 1) or less. The response sensitivity or a conversion function $\alpha(f)$ is changed depending on (in inverse proportional to) a frequency f of a RF power used in RF bias as illustrated in FIG. 3, and expressed by the following equation (1).

$$\alpha(f)=1/\{(cf\tau_i)^p+1\}^{1/p} \quad (1)$$

But, $c=0.3\times2\pi$, $p=5$, $\tau_i=3s(M/2\,eV_s)$, M denotes mass number of ions, s denotes ions passing time, and $V_s$ denotes a sheath voltage.

Therefore, a practical sheath voltage, that is, an ion response voltage contributing to acceleration of ions within the ion sheath is expressed by the following equation (2).

$$V_i(t)=\alpha(f)V_s(t) \quad (2)$$

The ion response voltage $V_i(t)$ illustrated in FIG. 2 and the conversion function $\alpha(f)$ illustrated in FIG. 3 are related to $Ar^+$ ion, but other ions have the same characteristic with respect to the sheath voltage $V_s(t)$ and a frequency of the RF bias.

As can be seen from the voltage waveform of FIG. 2, ions within the ion sheath respond to (accelerate) first high frequency power $RF_1$ having a relatively low frequency (0.8 MHz) at about 100% sensitivity ($\alpha(f)\approx1$) and respond to (accelerate) first high frequency power $RF_1$ having a relatively high frequency of 13 MHz at about 50% sensitivity ($\alpha(f)\approx0.5$).

Figure 4:
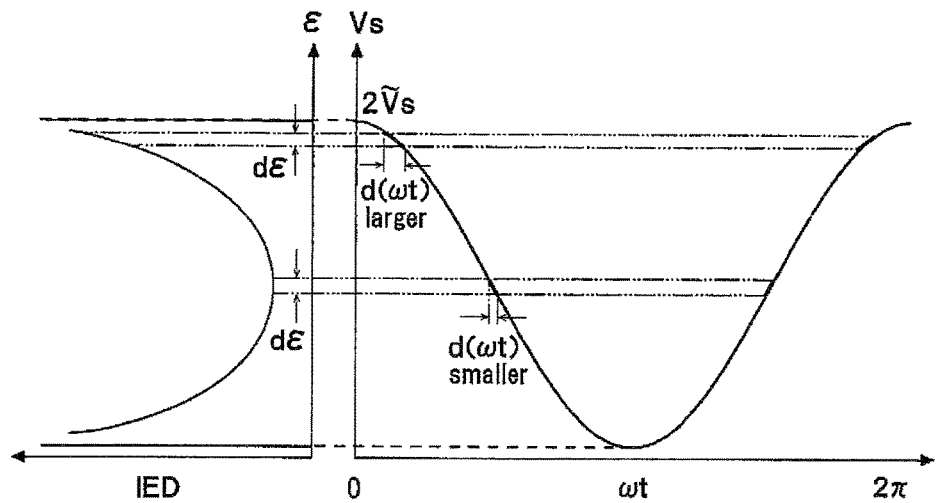
FIG. 4 is a view illustrating an ion energy distribution and an ion response voltage in a single-frequency RF bias method.
Figure 5:
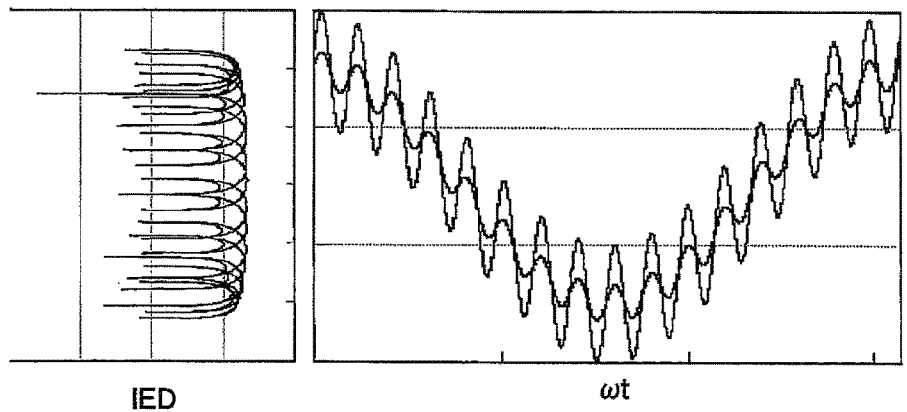
FIG. 5 is a view illustrating an ion energy distribution and an ion response voltage in a dual-frequency RF bias method.

Ion energy distribution IED can be obtained by calculating in the same manner as illustrated in FIGS. 4 and 5 from the following equation (3) based on the ion response voltage $V_i(t)$ as described above.

$$IED(E_i)\propto\Sigma_i(dV_i/dt_i) \quad (3)$$

FIG. 4 illustrates the IED and an ion response voltage $V_i(t)$ in a case where a single RF power having a relatively low frequency is used for the RF bias. In the meantime, FIG. 5 illustrates the IED and an ion response voltage $V_i(t)$ in a case where two RF powers respectively having a relatively low frequency and a relatively high frequency are used for the RF bias.

According to a single-frequency bias method using a single high frequency power for the RF bias, as described in detail with respect to FIGS. 15A to 15C and FIGS. 16A to 16C, an ion energy distribution (IED) represents a profile in which more ions are regularly concentrated (peaks appear) in the vicinity of the maximum energy and in the vicinity of the minimum energy, and thus, there is a limitation that the minimum energy cannot be arbitrarily varied even if the RF power may be varied in any way.

In contrast, according to dual-frequency bias method using two high frequency powers $RF_1$ having a frequency of 0.8 MHz and $RF_2$ having a frequency of 13 MHz as in the present exemplary embodiment, the maximum energy and the minimum energy of the IED can be controlled independently from each other by adjusting a total power and/or power ratio of both the $RF_1$ and $RF_2$.

Figure 6A:
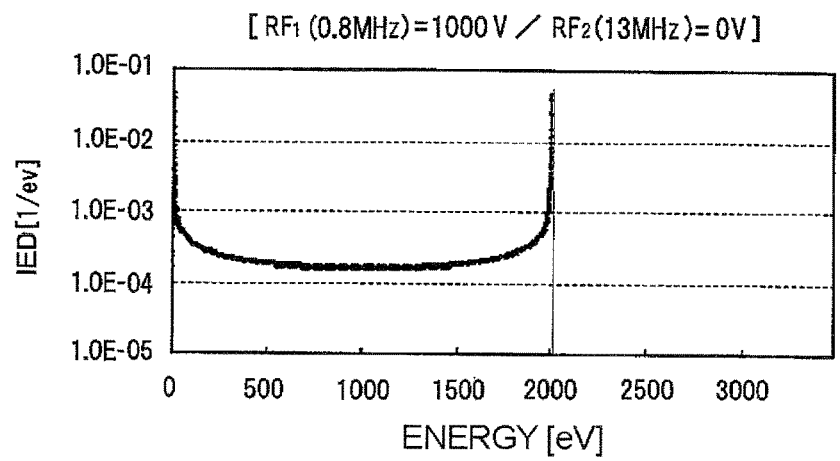
FIG. 6A is a view illustrating a function capable of arbitrarily adjusting the minimum energy within a predetermined range while the maximum energy of ion energy distribution is being fixed in the embodiment.
Figure 6B:
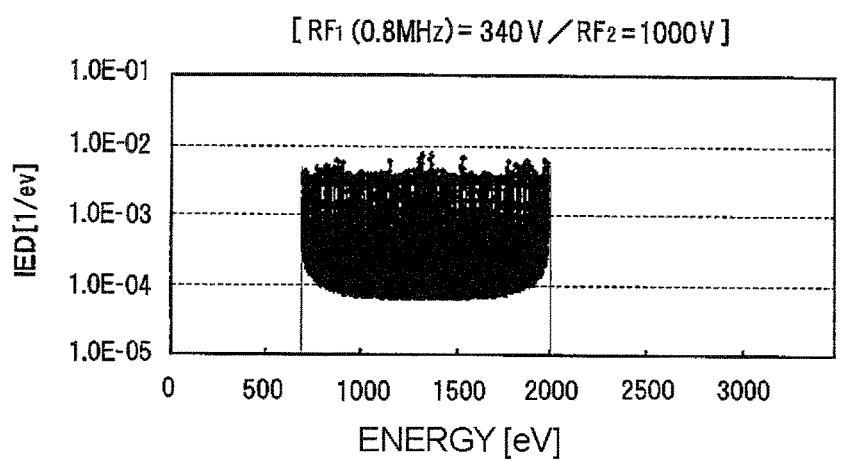
FIG. 6B is a view illustrating a function capable of arbitrarily adjusting the minimum energy within a predetermined range while the maximum energy of ion energy distribution is being fixed.
Figure 6C:
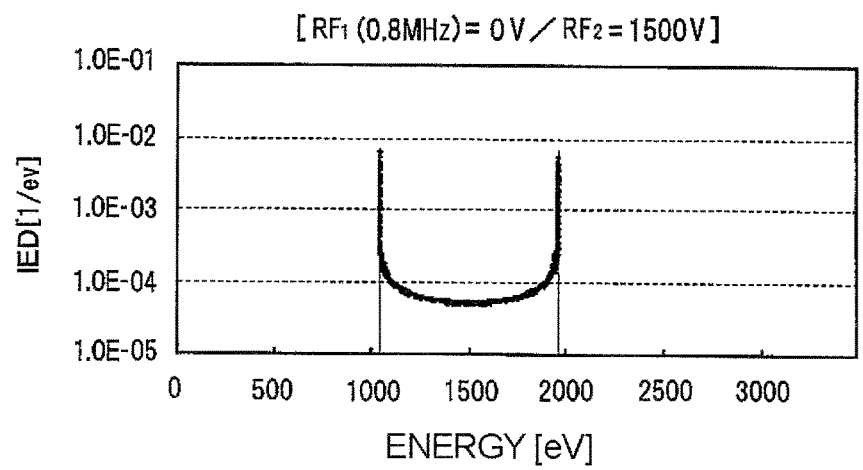
FIG. 6C is a view illustrating a function capable of arbitrarily adjusting the minimum energy within a predetermined range while the maximum energy of ion energy distribution is being fixed.

That is, in the present exemplary embodiment, as illustrated in FIGS. 6A to 6C, the minimum energy can be arbitrarily controlled within a range of, for example, from about 0 eV to 1000 eV while the maximum energy is fixed to, for example, about 2000 eV.

Figure 7A:
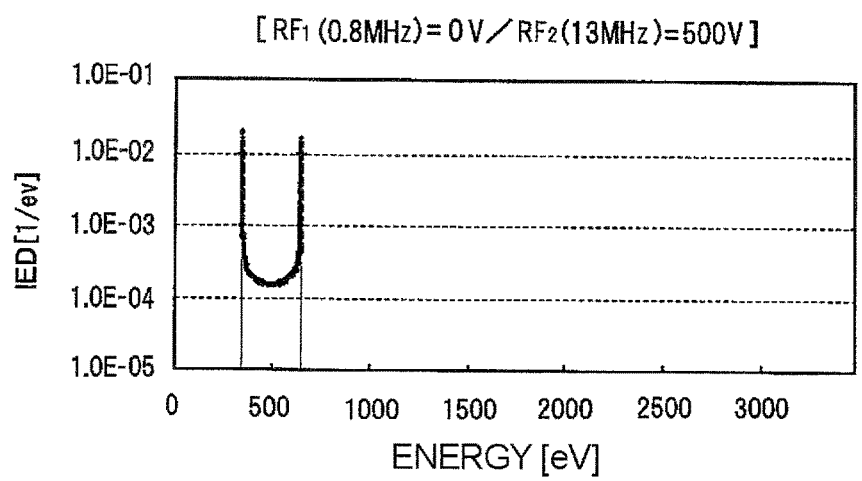
FIG. 7A is a view illustrating a function capable of arbitrarily adjusting the maximum energy within a predetermined range while the minimum energy of ion energy distribution is being fixed in the embodiment.
Figure 7B:
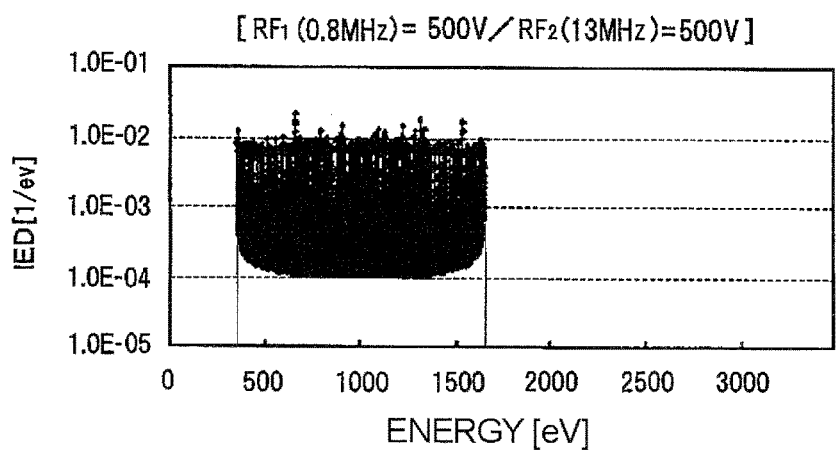
FIG. 7B is a view illustrating a function capable of arbitrarily adjusting the maximum energy within a predetermined range while the minimum energy of ion energy distribution is being fixed.
Figure 7C:
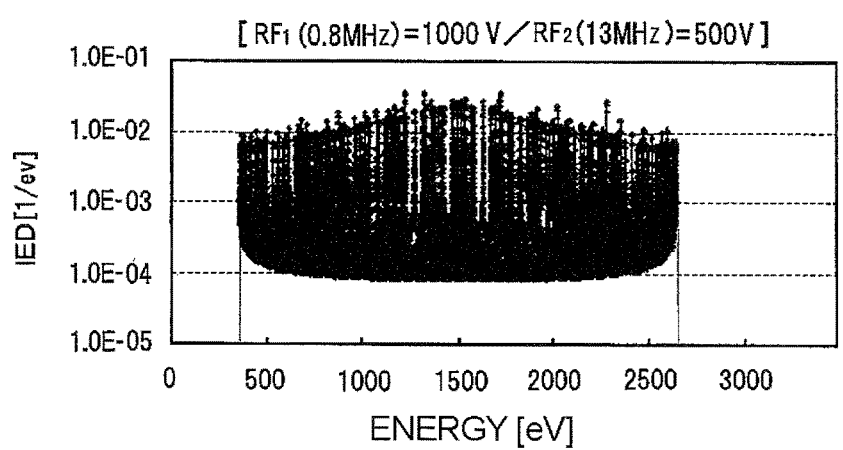
FIG. 7C is a view illustrating a function capable of arbitrarily adjusting the maximum energy within a predetermined range while the minimum energy of ion energy distribution is being fixed.

Further, as illustrated in FIGS. 7A to 7C, the maximum energy can be arbitrarily controlled within a range of, for example, from about 650 eV to 2650 eV while the minimum energy is fixed to, for example, about 350 eV.

In the meantime, the IED characteristics in FIGS. 6A to 6C and FIGS. 7A to 7C are calculated with respect to $Ar^+$ ion. Other ions may have the same characteristics in pattern. Further, voltage values of both high frequency powers $RF_1$ having a frequency of 0.8 MHz and $RF_2$ having a frequency of 13 MHz are amplitudes of bias voltage of each high frequency power, and can be converted into an RF power.

Further, in the present embodiment, as illustrated in FIG. 6B [$RF_1$ (0.8 MHz) =340 V, $RF_2$ (13 MHz)=1000 V], and FIG. 7B [$RF_1$ (0.8 MHz)=500 V, $RF_2$ (13 MHz) =500 V], it is possible to substantially uniformly distribute ions throughout the entire area of energy band by the dual-frequency RF bias. Further, as illustrated in FIG. 7C [$RF_1$ (0.8 MHz)=1000 V, $RF_2$ (13 MHz)=500 V], it is possible to make the number of incident ions of intermediate energy level larger than those of the minimum energy and the maximum energy.

Figure 8A:
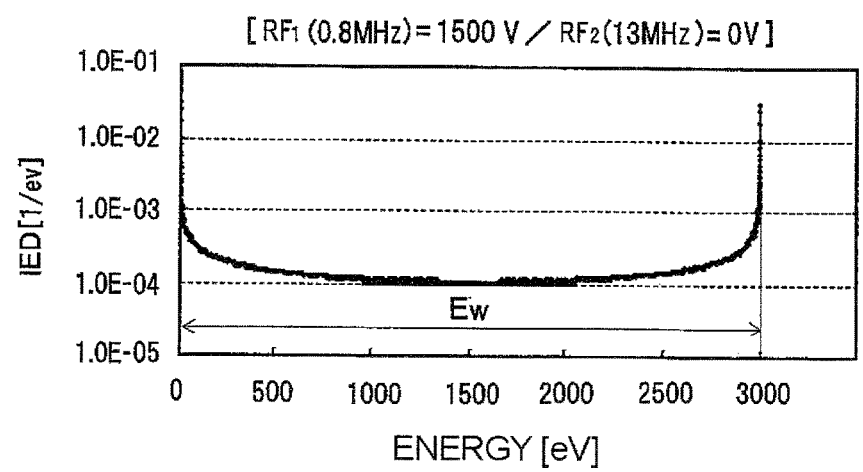
FIG. 8A is a view illustrating a function capable of arbitrarily varying a width of an energy band within a predetermined range while the central value of energy is being fixed in the embodiment.
Figure 8B:
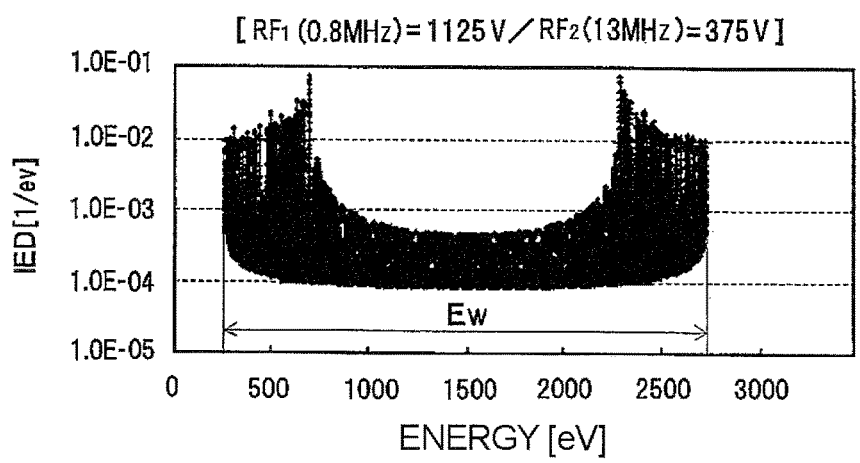
FIG. 8B is a view illustrating a function capable of arbitrarily varying the width of the energy band within a predetermined range while an average value of the energy (central value of energy) is being fixed in the embodiment.
Figure 8C:
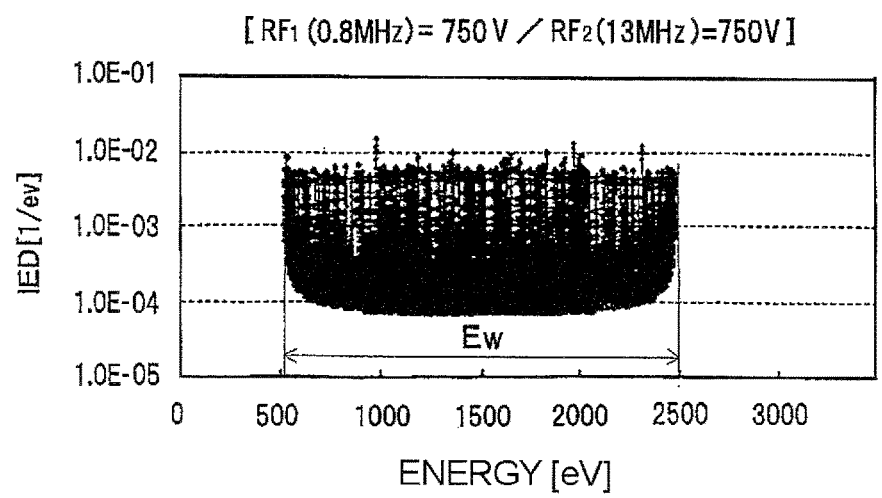
FIG. 8C is a view illustrating a function capable of arbitrarily varying the width of the energy band within a predetermined range while the average value of energy is being fixed in the embodiment.
Figure 8D:
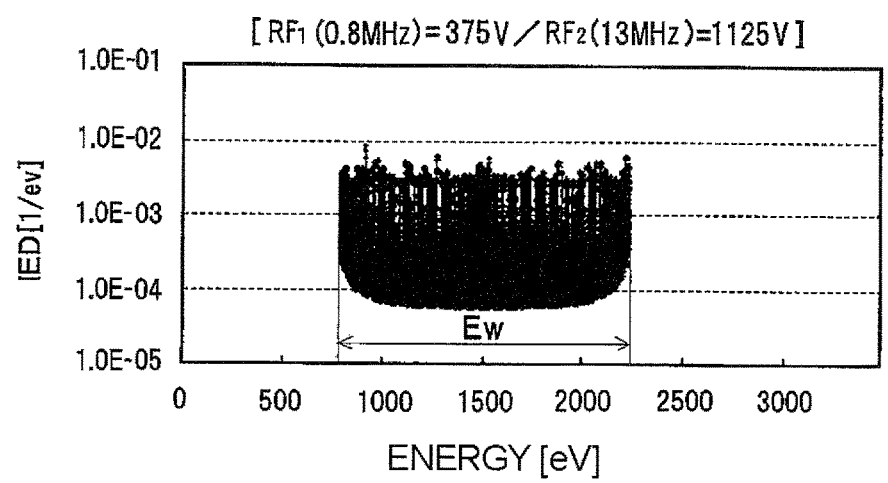
FIG. 8D is a view illustrating a function capable of arbitrarily varying the width of the energy band within a predetermined range while the average value of energy is being fixed in the embodiment.
Figure 8E:
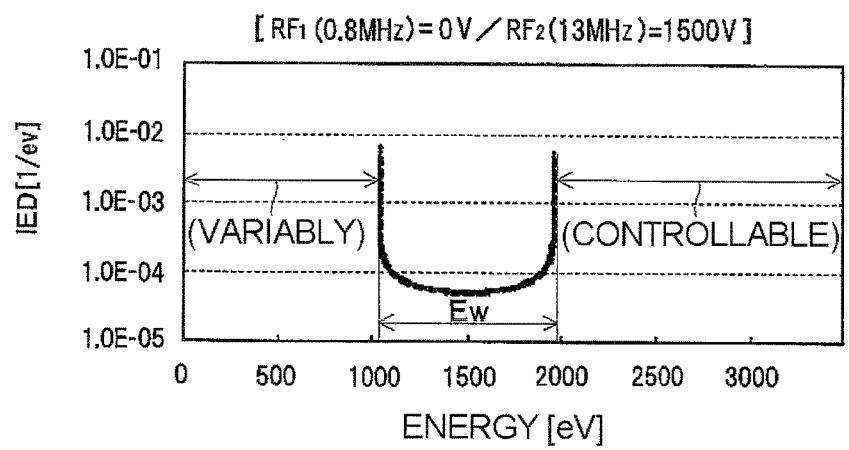
FIG. 8E is a view illustrating a function capable of arbitrarily varying the width of the energy band within a predetermined range while the average value of energy is being fixed in the embodiment.

Further, in the present embodiment, as illustrated in FIG. 8A [$RF_1$ (0.8 MHz)=1500 V, $RF_2$ (13 MHz)=0 V], FIG. 8B [$RF_1$ (0.8 MHz)=1125 V, $RF_2$ (13 MHz)=375 V], FIG. 8C [$RF_1$ (0.8 MHz)=750 V, $RF_2$ (13 MHz)=750 V], FIG. 8D [$RF_1$ (0.8 MHz)=375 V, $RF_2$ (13 MHz)=1125 V], and FIG. 8E [$RF_1$ (0.8 MHz)=0 V, $RF_2$ (13 MHz)=1500 V], it is also possible to arbitrarily adjust a width Ew of energy band within a range of from about 1000 eV to about 3000 eV while an average value or central value of energy is fixed to, for example, 1500 eV by the dual-frequency RF bias.

As described above, in the present exemplary embodiment, it is also possible to obtain an intermediate IED characteristic by arbitrarily adjusting width Ew of energy band between the IED characteristic (FIG. 8A) obtained in a case where only the first high frequency power $RF_1$ (0.8 MHz) is used for the RF bias and the IED characteristic (FIG. 8E) obtained in a case where only the second high frequency power $RF_2$ having a frequency of 13 MHz is used for the RF bias.

Further, among the intermediate IED characteristics, the IED characteristic of FIG. 8B obtained when a power ratio of second high frequency power RF2 to first high frequency power RF1 is 1125 V:375 V=3:1 exhibits a concave shaped distribution pattern. That is, ions are concentrated in a stripe shape at the minimum energy and an energy region (from about 250 eV to about 750 eV) in the vicinity thereof, and the maximum energy and an energy region (from about 2250 eV to about 2750 eV) in the vicinity thereof, and the number of distributed ions are uniformly small at an intermediate energy region (from about 750 eV to about 2250 eV). The concave shaped IED characteristic is also different from a U shaped IED characteristic (FIG. 8A, FIG. 8E) in which ions are concentrated in peak at the minimum energy and the maximum energy as in the case where any one of both high frequency powers $RF_2$ and $RF_1$ is used.

In the meantime, though not illustrated, and also in the intermediate energy region from FIG. 8D [$RF_1$ (0.8 MHz)=375 V, $RF_2$ (13 MHz)=1125 V] to FIG. 8E [$RF_1$ (0.8 MHz)=0 V, $RF_2$ (13 MHz)=1500 V], that is, even when a power ratio of second high frequency power $RF_2$ to first high frequency power $RF_1$ is about 1:30, the concave shaped intermediate IED characteristic as illustrated in FIG. 8B can be obtained.

As described above, in the present exemplary embodiment, the first high frequency power $RF_1$ and the second high frequency power $RF_2$ different from each other in frequency is combined and used to control the total power and/or power ratio thereof, so that the width of energy band, a distribution shape thereof, and further a total amount of incident energy can be widely and variously controlled with respect to the IED of ions incident on the surface of semiconductor wafer W on susceptor 12.

Here, the frequencies $f_1$ and $f_2$ of first high frequency power $RF_1$ and second high frequency power $RF_2$ are not limited to the above-described value (0.8 MHz, 13 MHz), but may be arbitrarily selected within a predetermined range. As can be seen from a comparison of the IED characteristic of FIG. 8A and that of FIG. 8E, a width (energy band) $E_W$ of the ion energy distribution in the single-frequency bias becomes wider as the frequency becomes lower, and becomes narrower as the frequency becomes higher.

Figure 9:
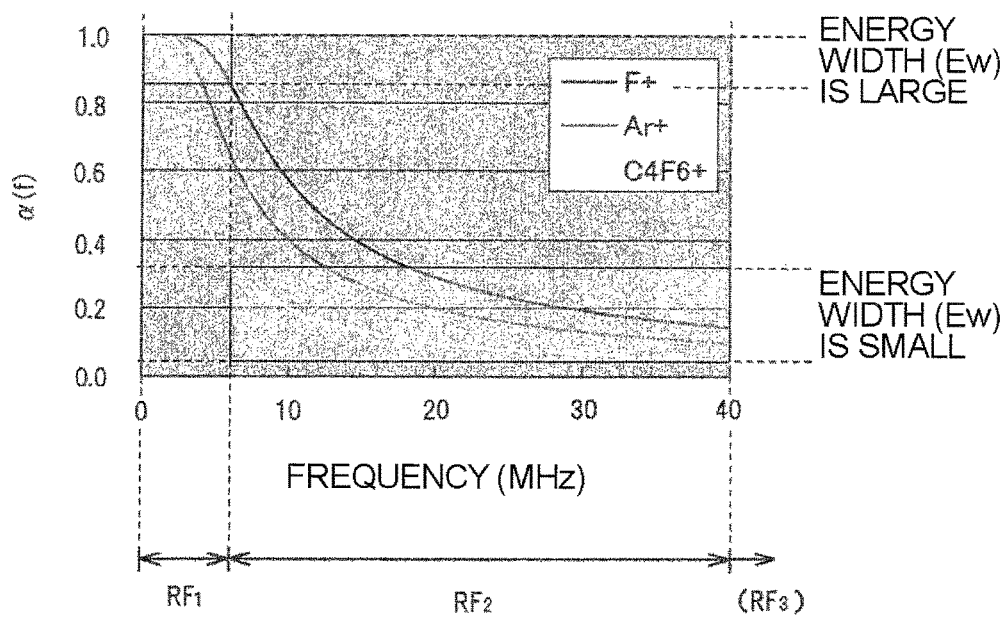
FIG. 9 is a view illustrating a frequency combination method in the dual-frequency bias method in the embodiment.

This, as illustrated in FIG. 9, corresponds to a relationship of the frequency and conversion function $\alpha(f)$. Accordingly, the variable range increase of the energy band $E_W$ depends on the kind of ions ($F^+$, $Ar^+$, $C_4F_6^+$ or the like) that exhibits a dominant action in an etching process, but basically, it is desirable that the frequency of first high frequency power $RF_1$ may be selected to be a low value (preferably, 100 kHz to 6 MHz) and the frequency of second high frequency power $RF_2$ may be selected to be a high value (preferably, 6 MHz to 40 MHz). In particular, when the frequency of second high frequency power $RF_2$ becomes too high, that is, becomes 40 MHz or more, an effect of plasma generation becomes stronger, resulting in an inappropriate frequency for the RF bias, and thus the frequency of 40 MHz or less is desirable. In the meantime, the frequency of the third high frequency power $RF_3$ for generating plasma is typically selected within a range of from 40 MHz to 300 MHz.

[Serial Resonance Around Upper Electrode and Countermeasure Thereof]

Meanwhile, since a plasma is generally a nonlinear load, so that an inter-modulation distortion (IMDs) is inevitably generated at frequencies either between harmonic frequencies having integer multiples of each fundamental frequency or between fundamental frequencies, but also at the sum and difference frequencies of the fundamental frequencies and at multiples of those sum and difference frequencies. The power of the fundamental frequency is increasingly interfered with powers of these harmonic frequencies or IMD as those is increased, and further, if high current flows into the filter circuit, there may be a case where the circuit element is burned to be damaged. In particular, in a cathode coupling type of the capacitively coupled type plasma processing apparatus in the present embodiment, occurrence of the case is remarkable when a serial resonance is generated with respect to any one of the harmonics or the IMD on the RF transmission line (hereinafter, referred to as "an RF transmission line around the upper electrode") which spans from the plasma within the chamber through the counter electrode to the ground potential. Furthermore, even when a serial resonance is generated with respect to any one of the fundamental frequencies, an impedance element of the filter circuit may be burned, so that it is undesirable.

Accordingly, there is a need to take a measure so that a serial resonance does not occur on the RF transmission line around the upper electrode for any one of the fundamental frequencies, the harmonics and the IMDs. However, as in the present embodiment, when three kinds of high frequency powers $RF_1$, $RF_2$, $RF_3$ are superimposed and applied to susceptor (lower electrode) 16, a multiple types and a number of the fundamental frequencies, the harmonics and the IMDs are present. Thus, it is very difficult to establish a countermeasure against the serial resonance. Further, an ion sheath (hereinafter, referred to as "upper electrode sheath") formed between the plasma and the upper electrode makes it further difficult to establish the countermeasure. The upper electrode sheath acts as a condenser for electronic current and the thickness thereof (and further, capacitance thereof) is varied according to a process condition (pressure, RF power, gas species or the like) or the DC voltage $V_{DC}$. Therefore, the frequency (serial resonant frequency) at the time when the serial resonance is generated on the RF transmission line around the upper electrode is varied according to the thickness of the upper electrode sheath. This point may be considered sufficiently.

In the present exemplary embodiment, as will be described below, the serial resonance problem as described above is solved by establishing the frequency-impedance characteristic around upper electrode 48 in consideration of all the low order frequencies of the IMDs relevant to and affecting the plasma process in the three-frequency superimposing application scheme.

Figure 10:
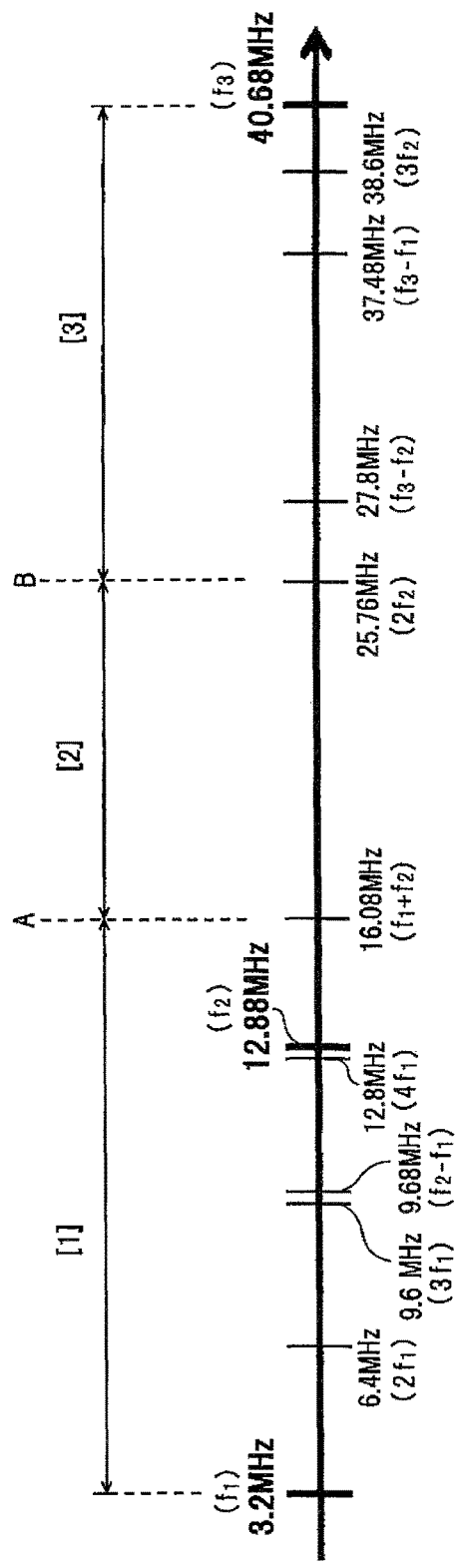
FIG. 10 is a view illustrating a distribution of main frequencies relevant to or affecting the plasma process in the embodiment.

FIG. 10 illustrates a distribution of main frequency relevant to or affecting the plasma process in the embodiment in a case where $f_1$=3.2 MHz, $f_2$=12.88 MHz, and $f_3$=40.68 MHz are selected as the frequencies of $f_1$, $f_2$, and $f_3$ of first, second and third high frequency powers $RF_1$, $RF_2$, and $RF_3$. Even when a high frequency power and an IMD other than those illustrated are generated, power levels thereof are very low. Accordingly, there is almost no possibility of affecting the process, so that it is negligible.

In this case, relationships of $2f_1$ (6.4 MHz)<$f_2$ (12.88 MHz) as well as $2f_2$ (25.76 MHz)<$f_3$ (40.68 MHz) are established, and a relationship of $3f_2$ (38.64 MHz)<$f_3$ (40.68 MHz) is also established. Therefore, $f_1+f_2$ (16.08 MHz) is set as a first frequency A. Further, the lower one of $2f_2$ (25.76 MHz) and $f_3-f_2$ (27.8 MHz) is set as a second frequency B.

Then, in a frequency range [1] of $f_1$<f≤A, a second harmonic $2f_1$ (6.4 MHz) of a frequency $f_1$ of the first high frequency power $RF_1$, a third harmonic $3f_1$ (9.6 MHz) of the first high frequency power $RF_1$, a difference frequency $f_2-f_1$ (9.68 MHz) from the frequency $f_2$ of the second high frequency power $RF_2$ to the frequency $f_1$ of the first high frequency power $RF_1$, a fourth harmonic frequency $4f_1$ (12.8 MHz) of the frequency $f_1$ of the first high frequency power $RF_1$, the frequency $f_2$ (12.88 MHz) of the second high frequency power $RF_2$, a sum frequency $f_1+f_2$ (16.08 MHz) of the sum of the frequency $f_2$ of second high frequency power $RF_2$ and the frequency $f_1$ of first high frequency power $RF_1$ are present in this order from a low frequency side.

Further, in a frequency range [3] of B≤f<$f_3$, a second harmonic frequency $2f_2$ (25.7 MHz) of the frequency $f_2$ of the second high frequency power $RF_2$, a frequency $f_3-f_2$ (27.8 MHz) of the difference from a frequency $f_3$ of third high frequency power $RF_3$ to the frequency $f_2$ of second high frequency power $RF_2$, a frequency $f_3-f_1$ (37.48 MHz) of the difference from the frequency $f_3$ of third high frequency power $RF_3$ to the frequency $f_1$ of first high frequency power $RF_1$, and a third harmonic $3f_2$ (38.6 MHz) of the frequency $f_2$ of second high frequency power $RF_2$ are present in this order from a low frequency side.

Here, it should be also noted that any one of frequencies $f_1$, $f_2$, $f_3$ of fundamental frequency powers $RF_1$, $RF_2$ and $RF_3$ as well as a frequency of either a low order harmonic frequency power or a low order IMD are not present in a frequency range [2] of A (16.08 MHz)<f<B (25.76 MHz).

In the present exemplary embodiment, in consideration of the frequency distribution characteristic as described above, a filter circuit 86 is configured such that any resonant frequency is not present in the frequency range [1] of $f_1$<f≤A and in the frequency range [3] of B≤f<$f_3$, and a single serial resonant frequency $f_s$ and a single parallel resonant frequency $f_p$ are present in the relation of $f_s$<$f_p$ in the frequency range [2] of A<f<B which corresponds to an intermediate range.

Figure 11:
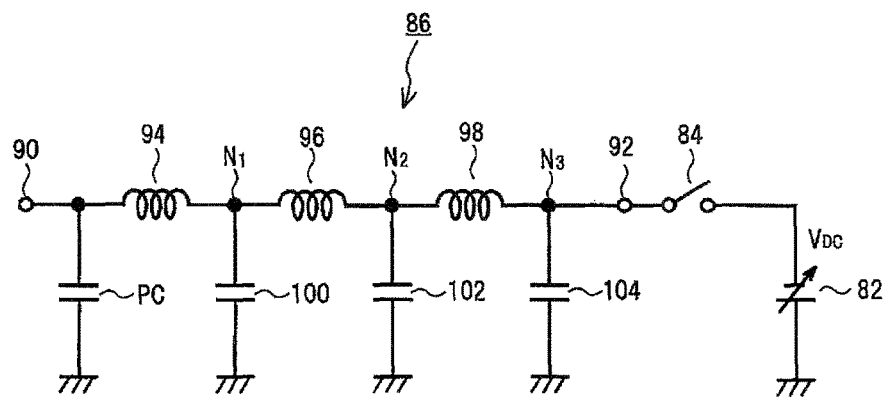
FIG. 11 is a circuit diagram illustrating a circuit configuration of a single filter circuit in the embodiment.

FIG. 11 illustrates a circuit configuration of filter circuit 86. Filter circuit 86 is formed with an LC ladder type circuit, and includes a plurality of, for example, three coils 94, 96, 98 connected in serial between a pair of input and output terminals 90, 92, and three condensers 100, 102, 104, each of which is connected between one of ground potential members (not illustrated) and one of a node $N_1$ between coils 94, 96, a node $N_2$ between coils 96, 98, and a node $N_3$ between coil 98 and terminal 92. Here, one terminal 90 is a terminal for a side connected to upper electrode 48. Terminal 90 serves as an input terminal for a high frequency power to be applied to filter circuit 86 from upper electrode 48 and serves as an output terminal for a DC voltage $V_{DC}$ to be applied to filter circuit 86 from DC power supply unit 82. The other terminal 92 is a terminal for a side connected to output terminal of DC power supply unit 82 through switch 84. The terminal 92 serves as an input terminal for a DC voltage $V_{DC}$ to be applied to filter circuit 86 from DC power supply unit 82 and serves as an output terminal for a high frequency power to be applied to filter circuit 86 from upper electrode 48.

Figure 12:
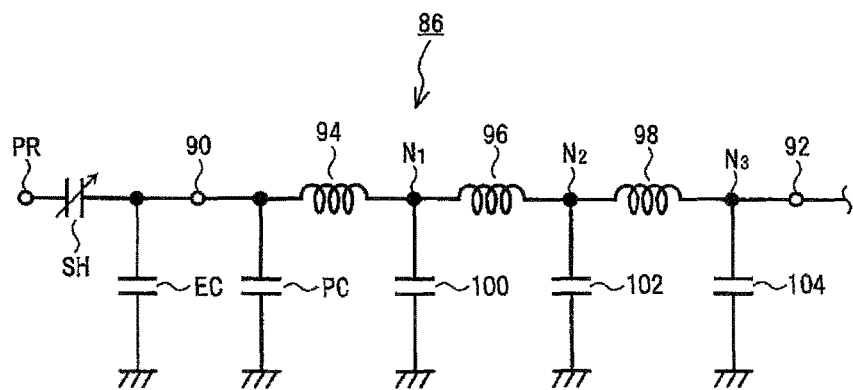
FIG. 12 is a circuit diagram illustrating a circuit configuration of an RF transmission line formed at a periphery of an upper electrode.

In such a filter circuit, a stray capacitance PC (hereinafter, referred to as "input port stray capacitance") having a very small fixed value is present in the vicinity of terminal 90 serving as an RF input terminal. In a state where filter circuit 86 is connected to upper electrode 48, input port stray capacitance PC is electrically connected in parallel to and combined with an electrode stray capacitance EC which is formed as a ring shaped insulator is interposed between upper electrode 48 and chamber 10, as illustrated in FIG. 12. The value $C_{EC}$ of electrode stray capacitance EC is typically 100 pF or more, whereas the value $C_{PC}$ of input port stray capacitance PC is typically 10 pF or less. Therefore, the percentage of $C_{PC}$ in a combined stray capacity ($C_{EC}+C_{PC}$) is very small. Therefore, the input port stray capacitance PC is substantially negligible. But, since the input port stray capacitance PC is a factor that gives a parallel resonant frequency at filter circuit 86 alone, it is considered once in the present exemplary embodiment.

FIG. 12 illustrates a circuit configuration of a RF transmission line when viewed from plasma PR within chamber 10 in a state where filter circuit 86 is connected to upper electrode 48. The circuit of the RF transmission line includes an upper electrode sheath formed between plasma PR and upper electrode 48 as a variable condenser SH. The capacitance $C_{SH}$ of variable condenser SH is varied depending on the thickness of the upper electrode sheath. That is, the capacitance $C_{SH}$ is decreased as the thickness of the upper electrode sheath is increased and the capacitance $C_{SH}$ is increased as the thickness of the upper electrode sheath is decreased. However, when the plasma PR is not generated within chamber 10, that is, when the upper electrode sheath is not present, the terminal of the plasma PR and the variable condenser SH is excluded from the RF transmission line circuit. In the meantime, since the inductance of upper electrode 48 is relatively low, it is ignored.

Since the RF transmission line circuit (FIG. 12) around upper electrode 48 is configured by a multistage LC series-parallel circuit, a plurality of serial resonant frequencies and a plurality of parallel resonant frequency are present, respectively, in a frequency-impedance characteristic thereof.

When plasma PR is not generated within chamber 10 (when the upper electrode sheath is not present), the highest serial frequency $f_s$ among the serial resonant frequencies is a resonant frequency of an LC serial circuit constituted with a first stage coil 94 and a first stage condenser 100, and when the plasma PR is generated within chamber 10 (when the upper electrode sheath is present), the highest serial frequency $f_s$ is a resonant frequency of an LC serial circuit constituted with a variable condenser SH, first stage coil 94 and first stage condenser 100.

The highest parallel frequency $f_p$ among the parallel resonant frequencies is a parallel resonant frequency of an LC serial-parallel circuit constituted with the electrode stray capacity EC and the input port stray capacity PC formed between input port 90 and the ground potential, first stage coil 94 and first stage condenser 100 irrespective of whether the plasma PR or the upper electrode sheath is present or not. Here, the combined capacity of condensers EC, PC, 100 in the LC serial-parallel circuit is larger than the capacity of condenser 100 of the LC serial circuit, so that a relationship of $f_s$<$f_p$ is established.

Further, the second parallel highest frequency $f_q$ among the parallel resonant frequencies is also a parallel resonant frequency of an LC serial-parallel circuit constituted with electrode stray capacity EC, input port stray capacity PC, a first stage coil 94, a second stage coil 96, and a second stage condenser 102 and formed between input port 90 and the ground potential, irrespective of whether plasma PR or the upper electrode sheath is present or not.

In filter circuit 86, coil 98 and condenser 104 after the third stage is related to a serial resonant frequency after a second serial resonant frequency and/or a parallel resonant frequency after a third parallel resonant frequency, and is not related to the highest serial resonant frequency $f_s$, the highest parallel resonant frequency $f_p$, and the second highest parallel resonant frequency $f_q$.

In the present exemplary embodiment, in consideration of the frequency distribution as described above (FIG. 10), the circuit constant of filter circuit 86 is selected such that the highest serial resonant frequency $f_s$ and the highest parallel resonant frequency $f_p$ fall within a frequency range [2] of A<f<B and the second highest parallel resonant frequency $f_q$ falls within a frequency range of f<$f_1$.

Specifically, for example, if the value $C_{EC}$ of the electrode stray capacity EC is 300 pF and the value $C_{PC}$ of t input port stray capacity PC is 7 pF, the inductance $L_{94}$ of first stage coil 94 and the capacitance $C_{100}$ of first stage condenser 100 are selected to be 400 nH and 200 pF, respectively, and the inductance $L_{96}$ of second stage coil 96 and the capacitance $C_{102}$ of second condenser 102 are selected to be 15 μH and 2500 pF, respectively. Accordingly, in a frequency-impedance characteristic when the plasma PR is not generated within chamber 10 (when the upper electrode sheath is not present), that is, in frequency-impedance characteristic when expecting an RF transmission line which spans from an interface between processing space PS and the upper electrode through the upper electrode to the ground potential, the highest serial resonant frequency $f_s$ is 18 MHz, the highest parallel resonant frequency $f_p$ is 23 MHz, and the second highest resonant frequency $f_q$ is 2 MHz.

Figure 13:
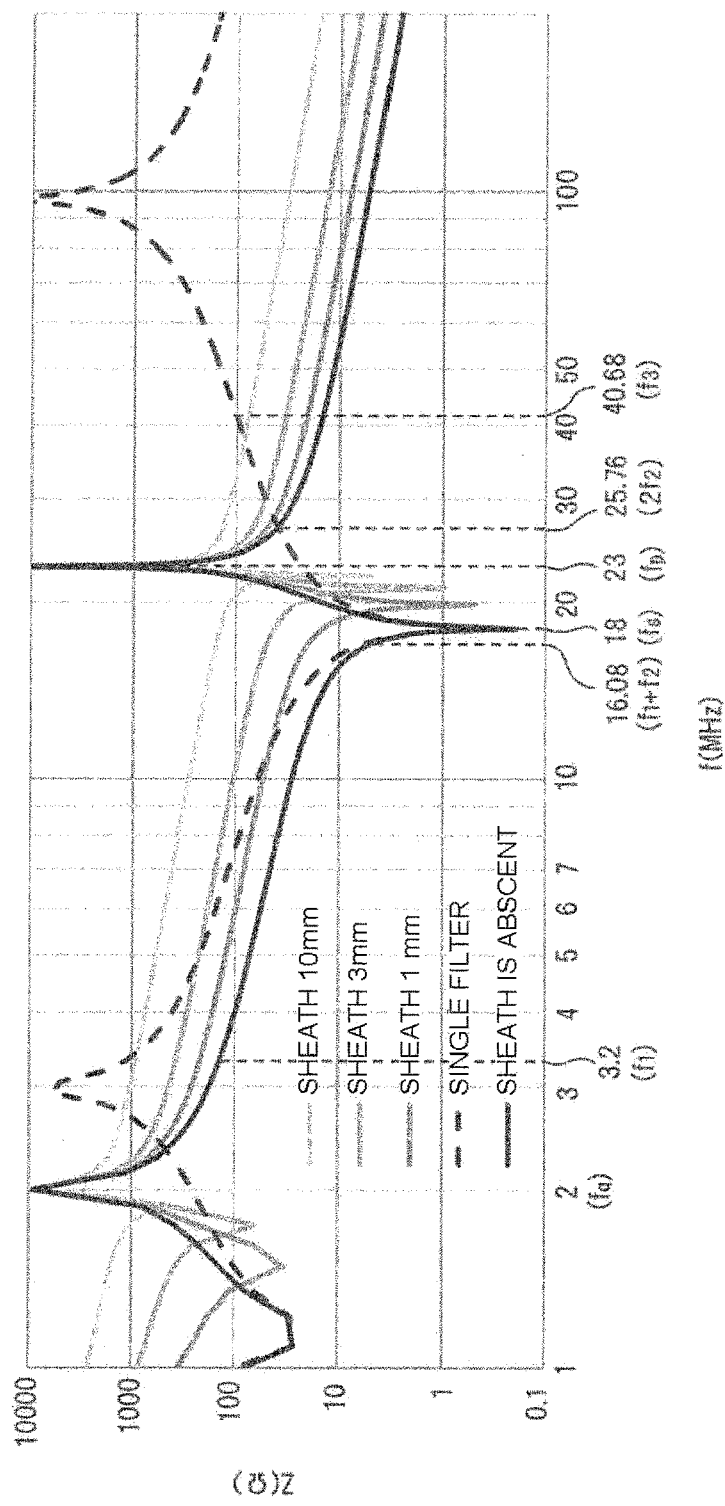
FIG. 13 is a view illustrating a frequency-impedance characteristic of the RF transmission line.

FIG. 13 illustrates a frequency-impedance characteristic on the RF transmission line around the upper electrode in the present exemplary embodiment. In the frequency-impedance characteristic, it should be noted that when plasma PR is generated within chamber 10 (when the upper electrode sheath is present), the respective serial resonant frequencies (especially, $f_s$) shift in an increasing direction while the respective parallel resonant frequencies (especially, $f_p$, $f_q$) almost hardly shift as the thickness of the upper electrode sheath is increased.

That is, the capacitance $C_{EC}$ of the variable condenser SH is decreased and further, the entire capacitance ($C_{EC}+C_{PC}+C_{100}$) decreases as the thickness of the upper electrode sheath is increased. Accordingly, the value of the serial resonant frequency $f_s$ becomes higher and so does serial resonant frequencies other than $f_s$. In the meantime, as described above, since the capacitance $C_{EC}$ of variable condenser SH is not related to the parallel resonance, even if the thickness of the upper electrode sheath increases, the values of the respective parallel resonant frequencies (especially, $f_p$, $f_q$) are not varied.

As described above, when plasma PR is generated within chamber 10 and the upper electrode sheath is formed, the serial resonant frequency $f_s$ shifts from a reference value 18 MHz when the upper electrode sheath is not present towards a higher frequency side. However, even if an amount of shift of the serial resonant frequency $f_s$ is increased as the thickness of the upper electrode sheath is increased, there is no case where the serial resonant frequency $f_s$ reaches the parallel resonant frequency $f_p$ having the fixed value (23 MHz). Further, any one of frequencies $f_1$, $f_2$, $f_3$ of fundamental frequency powers $RF_1$, $RF_2$, $RF_3$ does not fall within a region in which the value of the serial resonant frequency $f_s$ shifts, that is, in a frequency range [2] of A<f<B, and also, a frequency of principal harmonics or the frequency of IMD is not present at all.

Accordingly, in the plasma processing apparatus of the present exemplary embodiment, even when a process condition is set arbitrarily or the value of the DC voltage $V_{DC}$ applied to upper electrode 48 from DC power supply unit 82 is arbitrarily selected, there is no possibility that a serial resonance is generated on the RF transmission line around upper electrode 48. Therefore, there is no case where each of fundamental frequency powers $RF_1$, $RF_2$, $RF_3$ is varied to a harmonic or an IMD to cause a loss of the power. Further, there is no possibility that the circuit elements within filter circuit 86 are burned to be damaged by a high current.

Further, as illustrated in FIG. 13, an impedance for the third high frequency power $RF_3$ having a frequency of 40.68 MHz for generating plasma is increased as the thickness of the upper electrode sheath is increased. Here, there is also a relationship that the thickness of the upper electrode sheath is increased as an absolute value of the negative polarity DC voltage $V_{DC}$ is increased by applying the negative polarity DC voltage $V_{DC}$ to upper electrode 48 from DC power supply unit 82. Also, a ratio of electron current that flows to a sidewall of chamber from susceptor 16 side (not upper electrode 48) is increased as the impedance of the periphery of upper electrode 48 for the third high frequency power $RF_3$ having a frequency of 40.68 MHz for generating plasma is increased so that density of the plasma expands outside in a radial direction. Accordingly, it may also be possible to arbitrarily control uniformizing of the spatial distribution of the plasma density in a radial direction by adjusting the absolute value of the negative polarity DC voltage $V_{DC}$ applied to upper electrode 48.

Further, since energy of ions incident onto upper electrode 48 from the plasma increases as the thickness of the upper electrode sheath is increased, the sputter effect of physically removing sediments (deposition) such as polymer attached on the surface of upper electrode 48a by ion impact may be enhanced. Accordingly, the sputter effect (cleaning up of the electrode surfaces) for upper electrode 48 may also be controlled by adjusting the absolute value of the negative polarity DC voltage $V_{DC}$ applied to upper electrode 48.

[Other Exemplary Embodiment or Modified Example]

In the above-described exemplary embodiments, the frequencies $f_1$, $f_2$, $f_3$ of first, second and third high frequency powers $RF_1$, $RF_2$, $RF_3$ are $f_1$=3.2 MHz, $f_2$=12.88 MHz, and $f_3$=40.88 MHz, respectively, and the relationship of $3f_2<f_3$ is established. As another exemplary embodiment, a case has been considered where the frequencies $f_1$, $f_2$, $f_3$ of first, second and third high frequency powers $RF_1$, $RF_2$, $RF_3$ are $f_1$=3.2 MHz, $f_2$=16.0 MHz, and $f_3$=40.88 MHz. In this case, the relationship of $2f_1$ (6.4 MHz)<$f_2$ (16.0 MHz) as well as $2f_2$ (32.0 MHz)<$f_3$ (40.68 MHz) is established, and further, the relationship of $f_3$ (40.68 MHz)<$3f_2$ (48.0 MHz) is established.

As described above, in the case where the relationship of $3f_2<f_3$ is established, the higher one of $f_3-f_2$ (24.68 MHz) and $f_1+f_2$ (19.2 MHz) is set as A, and the lower one of $2f_2$ (32.0 MHz) and $f_3-f_1$ (37.48 MHz) is set as B.

Figure 14:
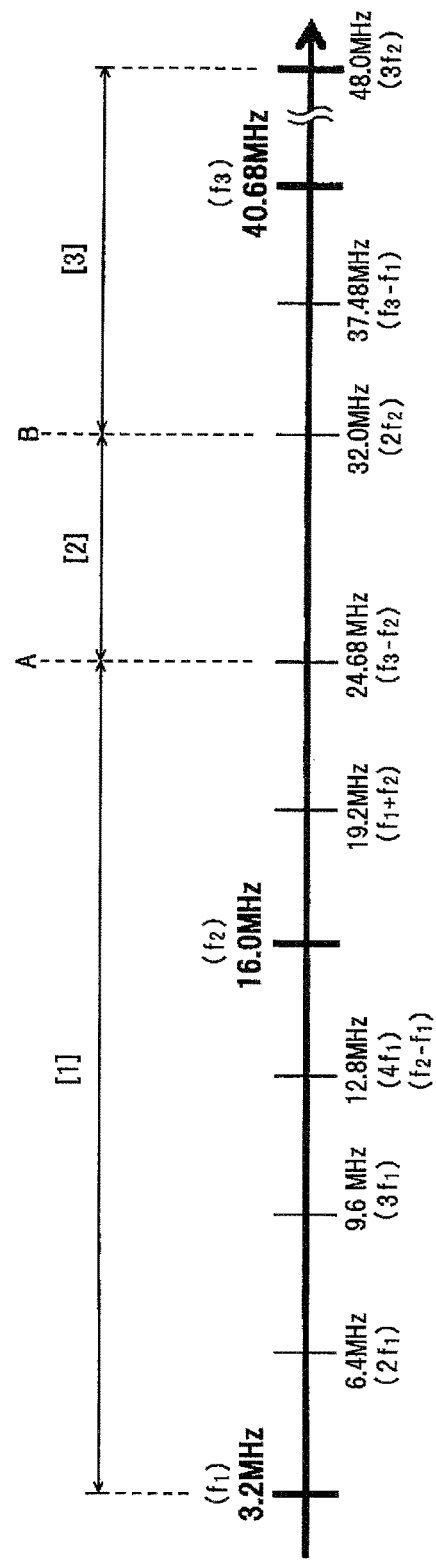
FIG. 14 is a view illustrating a distribution of main frequencies relevant to or affecting the plasma process in another embodiment.
Figure 15A:
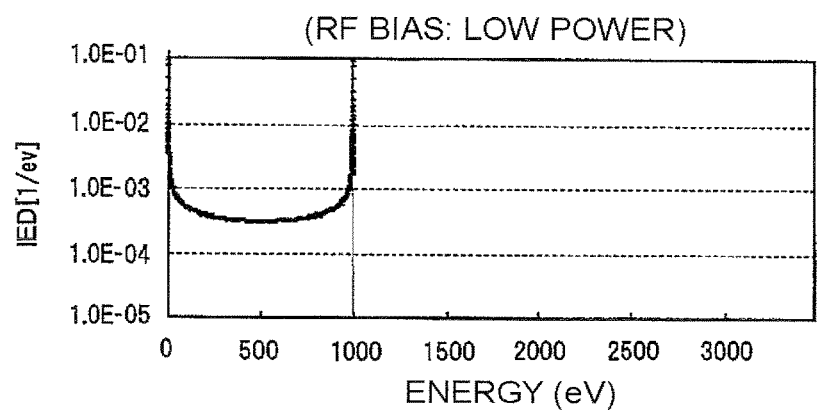
FIG. 15A is a view illustrating an ion energy distribution obtained when an RF power is set to a low level in a conventional single-frequency bias method in which a relatively low frequency is used.
Figure 15B:
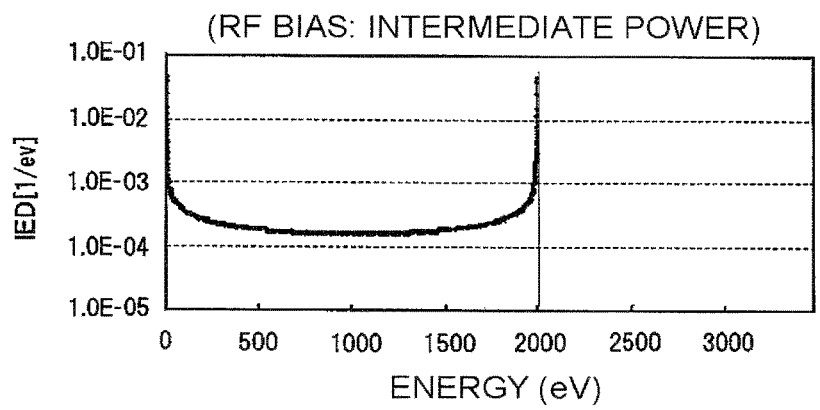
FIG. 15B is a view illustrating an ion energy distribution obtained when an RF power is set to an intermediate level in a conventional single-frequency bias method in which a relatively low frequency is used.
Figure 15C:
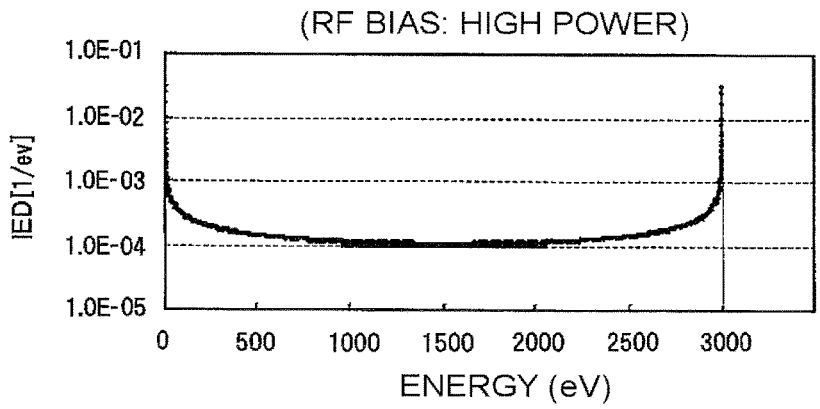
FIG. 15C is a view illustrating an ion energy distribution obtained when an RF power is set to a high level in a conventional single-frequency bias method in which a relatively low frequency is used.
Figure 16A:
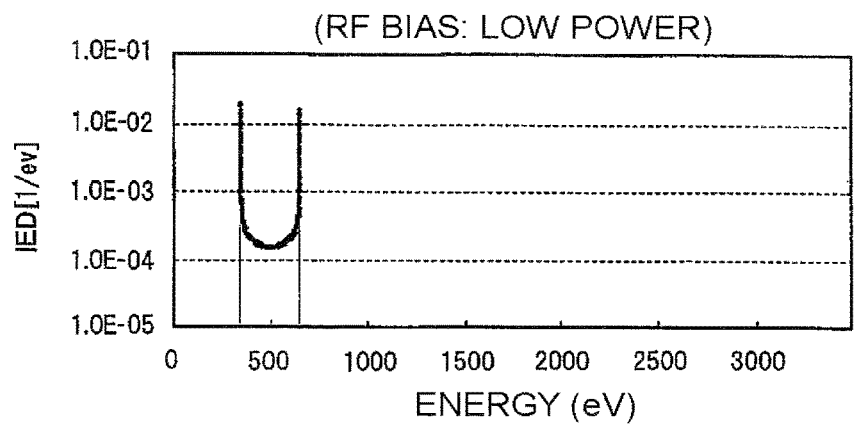
FIG. 16A is a view illustrating another ion energy distribution obtained when an RF power is set to a lower level value in a conventional single-frequency bias method in which a relatively high frequency is used.
Figure 16B:
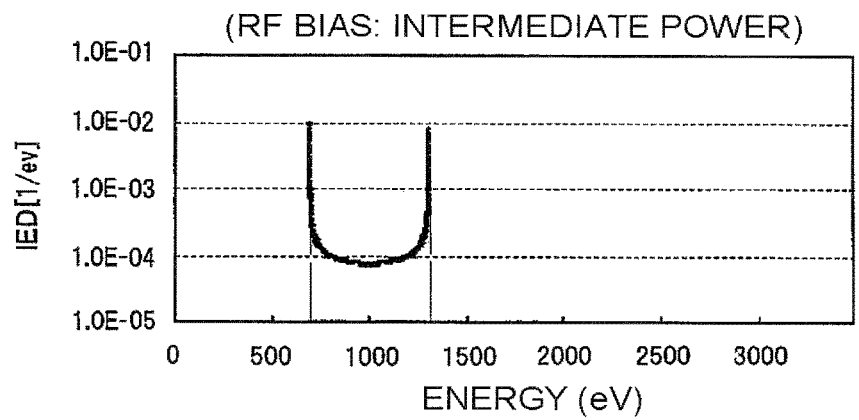
FIG. 16B is a view illustrating another ion energy distribution obtained when an RF power is set to an intermediate level value in a conventional single-frequency bias method in which a relatively high frequency is used.
Figure 16C:
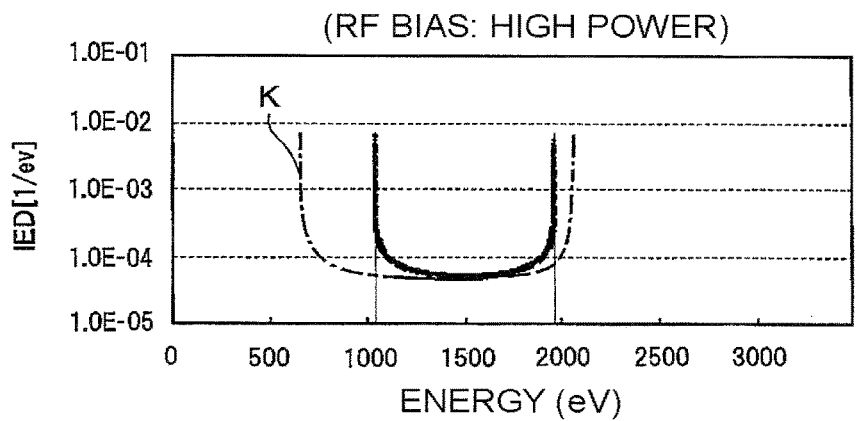
FIG. 16C is a view illustrating an ion energy distribution obtained when an RF power is set to a high level in a conventional single-frequency bias method in which a relatively high frequency is used.

Then, as illustrated in FIG. 14, in the frequency range [1] of $f_1$ (3.2 MHz)<f≤A, a second harmonic frequency $2f_1$ (6.4 MHz) of a frequency $f_1$ of first high frequency power $RF_1$, a third harmonic frequency $3f_1$ (9.6 MHz) of the first frequency $f_1$ of first high frequency power $RF_1$, a difference frequency $f_2-f_1$ (12.8 MHz) from a frequency $f_2$ of second high frequency power $RF_2$ to the frequency $f_1$ of the first high frequency power $RF_1$, a fourth harmonic frequency $4f_1$ (12.8 MHz) of the frequency $f_1$ of first high frequency power $RF_1$, a frequency $f_2$ (16.0 MHz) of second high frequency power $RF_2$, a sum frequency $f_1+f_2$ (19.2 MHz) of the frequency $f_2$ of second high frequency power $RF_2$ and the frequency $f_1$ of first high frequency power $RF_1$, a difference frequency $f_3-f_2$ (24.68 MHz) from a frequency $f_3$ of third high frequency power $RF_3$ to the frequency $f_2$ of the second high frequency power $RF_2$ are present in this order from the lower frequency side.

Further, in the frequency range [3] of B≤f<$3f_2$ (48.0 MHz), a second harmonic frequency $2f_2$ (32.0 MHz) of the frequency $f_2$ of second high frequency power $RF_2$, a difference frequency $f_3-f_1$ (37.48 MHz) from the frequency $f_3$ of third high frequency power $RF_3$ to the frequency $f_1$ of first high frequency power $RF_1$, and a frequency $f_3$ (48.0 MHz) of third high frequency power $RF_3$ are present in this order from the lower frequency side.

Here, it should be also noted that any one of the frequencies $f_1$, $f_2$, $f_3$ of fundamental frequency powers $RF_1$, $RF_2$ and $RF_3$ as well as a frequency of either a low order harmonic frequency power or low order IMD are not present in the frequency range [2] of A (24.68 MHz)<f<B (32.0 MHz).

Therefore, in consideration of the frequency distribution as described above (FIG. 14), the circuit constant of filter circuit 86 is selected such that the highest serial resonant frequency $f_s$ and the highest parallel resonant frequency $f_p$ fall within the frequency range [2] of A<f<B and the second highest the parallel resonant frequency $f_q$ falls within the frequency region of f<$f_1$.

Specifically, for example, when the value $C_{EC}$ of e electrode stray capacity EC is 300 pF and the value $C_{PC}$ of input port stray capacity PC is 7 pF, the inductance $L_{94}$ of first stage coil 94 and the capacitance $C_{100}$ of first stage condenser 100 are selected to be 307 nH and 130 pF, respectively, and the inductance $L_{96}$ of second stage coil 96 and the capacitance $C_{102}$ of second condenser 102 are selected to be 15 μH and 2500 pF, respectively. Accordingly, in the frequency-impedance characteristic when plasma PR is not generated within chamber 10 (when the upper electrode sheath is not present), that is, in the frequency-impedance characteristic when an RF transmission line which spans from an interface between the processing space PS and upper electrode 48 through upper electrode 48 to the ground potential is expected, the highest serial resonant frequency $f_s$ is 26 MHz, the highest parallel resonant frequency $f_p$ is 31 MHz, and the second highest parallel resonant frequency $f_q$ is 2 MHz.

Accordingly, even in this case, even when a process condition is set arbitrarily or the value of the DC voltage $V_{DC}$ applied to upper electrode 48 from DC power supply unit 82 is selected arbitrarily, there is no possibility that a serial resonance is generated on the RF transmission line around upper electrode 48. Therefore, when there is no case where each of fundamental frequency powers $RF_1$, $RF_2$, $RF_3$ is varied into a harmonic frequency or an IMD to cause a loss of the power, there is also no possibility that the circuit elements within filter circuit 86 are burned to be damaged by a high current. In the meantime, it may also be possible either to arbitrarily control the spatial distribution of the plasma density in a radial direction by adjusting the absolute value of the negative polarity DC voltage $V_{DC}$ applied to upper electrode 48 or to control the sputter effect (cleaning up of electrode surface) for upper electrode 48.

Filter circuit 86 is not limited to the LC ladder type circuit as described above, and may include, for example, an L type circuit constituted with a single coil 94 and a single condenser 100. In this case, in the frequency-impedance characteristic when a RF transmission line which spans from the plasma PS through upper electrode 48 to the ground potential, a single serial resonant frequency and a single parallel resonant frequency are present.

That is, the unique serial resonant frequency $f_s$ is a resonant frequency of an LC serial circuit constituted with coil 94 and condenser 100 when plasma PR is not generated within chamber 10 (when the upper electrode sheath is not present), and is a resonant frequency of an LC serial circuit constituted with a variable condenser SH, coil 94 and condenser 100 when plasma PR is generated within chamber 10 (when the upper electrode sheath is present). Further, the unique parallel resonant frequency $f_p$ is a parallel resonant frequency of an LC serial-parallel circuit constituted with electrode stray capacity EC and input port stray capacity PC formed between input port 90 and the ground potential, coil 94 and condenser 100 irrespective of whether plasma PR (the upper electrode sheath) is present or not. Even in this case, a combined capacity ($C_{EC}+C_{PC}+C_{100}$) of condensers EC, PC, 100 in the LC serial-parallel circuit is larger than the capacity $C_{100}$ of condenser 100 of the LC serial circuit, so that the relationship of $f_s<f_p$ is established.

As described above, since the frequency region of f<$f_s$ becomes a frequency region in which the frequency is monotonically decreasing, no resonant frequency is present in the frequency range of $f_1<f\leq A$. Further, since the frequency region of $f_p<f$ becomes a frequency region in which the frequency is monotonically increasing, no resonant frequency is present in the frequency range of B≤f<$3f_3$ or B≤f<$3f_2$. Therefore, the same effect may be obtained as in the case where filter circuit 86 is constituted with an LC ladder type circuit.

The present disclosure is not limited to a capacitively coupled plasma etching apparatus, and may also be applied to a capacitively coupled plasma processing apparatus that performs any plasma process, such as a plasma CVD, a plasma ALD, a plasma oxidation, a plasma nitridation, and a sputtering. The target substrate in the present disclosure is not limited to a semiconductor wafer, but may include various substrates for, such as a flat panel display, an organic EL device, or a solar cell, a photomask, a CD substrate, or a print substrate.

EXPLANATION OF REFERENCE NUMERALS

10: CYLINDRICAL VACUUM CHAMBER (PROCESSING CONTAINER)
16: SUSCEPTOR
35, 36, 38: RF POWER SUPPLY
40, 42, 43: MATCHING UNITS
48: UPPER ELECTRODE (SHOWER HEAD)
54: RING SHAPED INSULATOR
60: PROCESS GAS SUPPLY SOURCE
86: FILTER CIRCUIT
88: CONTROL UNIT
94, 96: COIL
100, 102: CONDENSER

What is claimed is:

1. A plasma processing apparatus comprising:
a vacuum exhaustible processing container configured to accommodate a target substrate to be able to be carried in and out in relation to the processing container;
first and second electrodes disposed to be opposed to each other within the processing container to form a processing space therebetween where plasma is generated so that a desired processing is performed on the substrate held on the first electrode under the plasma;
a first RF power supply configured to apply a first RF power having a first frequency ($f_1$) to the first electrode;
a second RF power supply configured to apply a second RF power having a second frequency ($f_2$) to the first electrode;
a third RF power supply configured to apply a third RF power having a third frequency ($f_3$) to the first electrode;
a control unit programmed to control a total power and a power ratio of the first RF power and the second RF power in order to control maximum energy and minimum energy of ion energy distribution independently from each other;
a filter circuit connected between the second electrode and a member having a ground potential, and configured to allow an RF current input from the first electrode through the processing space and the second electrode to flow to a grounded line,
wherein the filter circuit consists of: (i) a first coil of which a first terminal is connected to the second electrode via an input terminal, (ii) a first condenser connected between a second terminal of the first coil and the member having the ground potential, (iii) a second coil of which a third terminal is connected to the second terminal of the first coil, (iv) a second condenser connected between a fourth terminal of the second coil and the member having the ground potential, (v) a third coil of which a fifth terminal is connected to the fourth terminal of the second coil, (vi) a third condenser connected between a sixth terminal of the third coil and the member having the ground potential, (vii) the input terminal directly connected to the second electrode and the first terminal of the first coil, and (viii) an output terminal connected to the sixth terminal of the third coil;

a port stray capacitor connected between the first terminal and the member having ground potential; and an insulator is disposed between the second electrode and the processing container such that a value of an electrode stray capacity formed between the second electrode and the processing container becomes 300 pF, the first terminal of the first coil connected to the second electrode via the input terminal is configured such that a value of an input port stray capacity becomes 7 pF, each of the first coil and the first condenser is configured to have an inductance and a capacitance of 400 nH and 200 pF, respectively, and each of the second coil and the second condenser is configured to have an inductance and a capacitance of 15 µH and 2500 pF, respectively, wherein, the first frequency ($f_1$) is in a range of from 100 kHz to 6 MHz, the second frequency ($f_2$) is in a range of from 6 MHz to 40 MHz, and the third frequency ($f_3$) is in a range of from 40 MHz to 300 MHz, the relationships of $2f_1 < f_2$ and $2f_2 < f_3$ are established, wherein the filter circuit is configured such that, in a case where $3f_2 < f_3$, assuming that ($f_1+f_2$) is A and the lower one of $2f_2$ and ($f_3-f_2$) is B, no resonant frequency is present in the frequency range of $f_1 < f \leq A$ and $B \leq f < f_3$, and a single serial resonant frequency ($f_s$) and a single parallel resonant frequency ($f_p$) are present in the frequency range of $A < f < B$ with satisfying a relationship of $f_s < f_p$, in a frequency-impedance characteristic of an RF transmission line which spans from an interface between the processing space and the second electrode through the second electrode to the ground potential, wherein in a case where $f_3 < 3f_2$, assuming that the higher one of ($f_3-f_2$) and ($f_1+f_2$) is A and the lower one of $2f_2$ and ($f_3-f_1$) be B, no resonant frequency is present in the frequency range of $f_1 < f \leq A$ and $B \leq f < 3f_2$ (or $f_3$), and a single serial resonant frequency ($f_s$) and a single parallel resonant frequency ($f_p$) are present in the frequency range of $A < f < B$ with satisfying a relationship of $f_s < f_p$, in a frequency-impedance characteristic of an RF transmission line which spans from a boundary surface between the processing space and the second electrode through the second electrode to the ground potential.

2. The plasma processing apparatus of claim 1, wherein the serial resonant frequency ($f_s$) is an unique serial resonant frequency present in the frequency-impedance characteristic, and the parallel resonant frequency ($f_p$) is an unique parallel resonant frequency present in the frequency-impedance characteristic, in a case where $3f_2 < f_3$, the first and second frequencies ($f_1$, $f_2$), second, third and fourth harmonic frequencies of the first frequency ($2f_1$, $3f_1$, $4f_1$), and the difference frequency ($f_2-f_1$) and the sum frequency ($f_1+f_2$) of the first frequency ($f_1$) and the second frequency ($f_2$) are present in a frequency region lower than the serial resonant frequency ($f_s$) in the frequency-impedance characteristic, and the third frequency ($f_3$), second and third harmonic frequencies of the second frequency ($2f_2$, $3f_2$), the difference frequency ($f_3-f_2$) from the third frequency ($f_3$) to the second frequency ($f_2$), and the difference frequency ($f_3-f_1$) from the third frequency ($f_3$) to the first frequency ($f_1$) are present in a frequency region higher than the parallel resonant frequency $f_p$ in the frequency-impedance characteristic, and in a case where $f_3 < 3f_2$, the first frequency ($f_1$), the second, third, and fourth harmonic frequencies of the first frequency ($2f_1$, $3f_1$, $4f_1$), the difference frequency ($f_2-f_1$) and the sum frequency ($f_1+f_2$) of the first frequency ($f_1$) and the second frequency $f_2$, and the difference frequency ($f_3-f_2$) of the third frequency ($f_3$) and the second frequency ($f_2$) are present in a frequency region lower than the serial resonant frequency ($f_s$) in the frequency-impedance characteristic, and the third frequency ($f_3$), the second and third harmonic frequencies of the second frequency ($2f_2$, $3f_2$), and the difference frequency ($f_3-f_1$) of the third frequency ($f_3$) and the first frequency ($f_1$) are present in a frequency region higher than the parallel resonant frequency ($f_p$) in the frequency-impedance characteristic.

3. The plasma processing apparatus of claim 2, wherein the serial resonant frequency ($f_s$) is defined by the inductance of the first coil and the capacitance of the first condenser, and the parallel resonant frequency ($f_p$) is defined by the inductance of the first coil and the capacitances of the first condenser and the second condenser.

4. The plasma processing apparatus of claim 1, wherein at least one serial resonant frequencies and at least two parallel resonant frequencies are present in the frequency-impedance characteristic, the serial resonant frequency ($f_s$) is the highest frequency among the serial resonant frequencies present in the frequency-impedance characteristic, the parallel resonant frequency ($f_p$) is the highest frequency among the parallel resonant frequencies present in the frequency-impedance characteristic, in a case where $3f_2 < f_3$, the first and second frequencies ($f_1$, $f_2$), the second, third and fourth harmonic frequencies of the first frequency ($2f_1$, $3f_1$, $4f_1$), the difference frequency ($f_2-f_1$) and the sum frequency ($f_1+f_2$) of the first frequency $f_1$ and the second frequency $f_2$ are present in a frequency region between a second highest parallel resonant frequency ($f_q$) and the serial resonant frequency ($f_s$) in the frequency-impedance characteristic, and the third frequency ($f_3$), the second and third harmonic frequencies of the second frequency ($2f_2$, $3f_2$), the difference frequency ($f_3-f_2$) of the third frequency $f_3$ and the second frequency $f_2$, and the difference frequency ($f_3-f_1$) from the third frequency $f_3$ to the first frequency $f_1$ in a frequency region higher than the parallel resonant frequency $f_p$ in the frequency-impedance characteristic, and in a case where $f_3 < 3f_2$, the first frequency ($f_1$), the second, third and fourth harmonic frequencies of the first frequency ($2f_1$, $3f_1$, $4f_1$), the difference frequency ($f_2-f_1$) and the sum frequency ($f_1+f_2$) of the first frequency ($f_1$) and the second frequency ($f_2$), and the difference frequency ($f_3-f_2$) from the third frequency ($f_3$) to the second frequency ($f_2$) are present in a frequency region from the second highest parallel resonant frequency ($f_q$) to the serial resonant frequency ($f_s$) in the frequency-impedance characteristic and the third frequency ($f_3$), the second and third harmonic frequencies of the second frequency ($2f_2$, $3f_2$), and the difference frequency ($f_3-f_1$) of the third frequency ($f_3$) and the first frequency ($f_1$) are present in a frequency region higher than the parallel resonant frequency ($f_p$) in the frequency-impedance characteristic.

5. The plasma processing apparatus of claim 4, wherein the serial resonant frequency ($f_s$) is defined by the inductance of the first coil and the capacitance of the first condenser, the parallel resonant frequency ($f_p$) is defined by the inductance of the first coil and capacitances of the first condenser and the third condenser, and the second highest parallel resonant frequency ($f_q$) is defined by inductances of the first and second coils and capacitances of the second and third condensers.

6. The plasma processing apparatus of claim 1, further comprising a DC power supply that applies a DC voltage to the second electrode through the filter circuit.

\* \* \* \* \*